United States Patent
Zhang et al.

(10) Patent No.: US 11,387,437 B2
(45) Date of Patent: Jul. 12, 2022

(54) METHOD OF FABRICATING DISPLAY SUBSTRATE, DISPLAY SUBSTRATE, AND DISPLAY APPARATUS

(71) Applicant: BOE Technology Group Co., Ltd., Beijing (CN)

(72) Inventors: Ziyu Zhang, Beijing (CN); Chunyan Xie, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 168 days.

(21) Appl. No.: 16/763,367

(22) PCT Filed: Aug. 26, 2019

(86) PCT No.: PCT/CN2019/102554
§ 371 (c)(1),
(2) Date: May 12, 2020

(87) PCT Pub. No.: WO2020/237861
PCT Pub. Date: Dec. 3, 2020

(65) Prior Publication Data
US 2021/0408508 A1    Dec. 30, 2021

Related U.S. Application Data

(63) Continuation-in-part of application No. PCT/CN2019/089421, filed on May 31, 2019.

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 51/5253* (2013.01); *H01L 27/3246* (2013.01); *H01L 27/3258* (2013.01); *H01L 2227/323* (2013.01)

(58) Field of Classification Search
CPC ....... H01L 51/56; H01L 51/5253–5256; H01L 27/3246; H01L 27/3258; H01L 2227/323
See application file for complete search history.

(56) References Cited

U.S. PATENT DOCUMENTS

2009/0273589 A1\*  11/2009  Asano ................. H01L 27/3283
                                                                    345/204
2014/0131683 A1    5/2014   Kim et al.
(Continued)

FOREIGN PATENT DOCUMENTS

CN           103811530 A       5/2014
CN           107180923 A       9/2017
(Continued)

OTHER PUBLICATIONS

Wang et al., English Translation, CN109742117A, published May 10, 2019, pp. 1-13 (Year: 2019).\*
(Continued)

*Primary Examiner* — Shaun M Campbell
(74) *Attorney, Agent, or Firm* — Intellectual Valley Law, P.C.

(57) ABSTRACT

A method of fabricating a display substrate having a display area and a peripheral area is provided. The method includes forming a plurality of light emitting elements on a base substrate and in the display area; forming an encapsulating layer on a side of the plurality of light emitting elements distal to the base substrate to encapsulate the plurality of light emitting elements; forming an insulating layer, wherein the insulating layer is formed between the encapsulating layer and the base substrate; and forming a first barrier wall in the peripheral area and on a side of the insulating layer away from the base substrate, the first barrier wall forming a first enclosure substantially surrounding a first area. A side of the first barrier wall away from the base substrate is wider
(Continued)

than a side of the first barrier wall closer to the base substrate.

20 Claims, 26 Drawing Sheets

(56) References Cited

U.S. PATENT DOCUMENTS

| | | | |
|---|---|---|---|
| 2016/0020299 A1* | 1/2016 | Gregory | H01L 29/66477 438/299 |
| 2019/0131365 A1* | 5/2019 | Jung | H01L 27/1248 |
| 2019/0288231 A1 | 9/2019 | He et al. | |
| 2020/0161406 A1* | 5/2020 | Lee | G09G 3/3648 |
| 2020/0295102 A1 | 9/2020 | Qin et al. | |

FOREIGN PATENT DOCUMENTS

| | | |
|---|---|---|
| CN | 107808896 A | 3/2018 |
| CN | 207637803 U | 7/2018 |
| CN | 108461525 A | 8/2018 |
| CN | 108539037 A | 9/2018 |
| CN | 109004106 A | 12/2018 |
| CN | 109103346 A | 12/2018 |
| CN | 109742117 A | 5/2019 |
| CN | 109801956 A | 5/2019 |
| CN | 109802052 A | 5/2019 |
| KR | 20160079477 A | 7/2016 |

OTHER PUBLICATIONS

Liu et al., English Translation, CN109004106A, published Dec. 14, 2018, pp. 1-9 (Year: 2018).*
Tao et al. English Translation, CN10718923A, published Sep. 19, 2017, pp. 1-14 (Year: 2017).*
International Search Report & Written Opinion dated Mar. 13, 2020, regarding PCT/CN2019/102554.
International Search Report & Written Opinion dated Feb. 28, 2020, regarding PCT/CN2018/089421.
First Office Action in the Chinese Patent Application No. 201980001470.0, dated Aug. 23, 2021; English translation attached.

* cited by examiner

METHOD OF FABRICATING DISPLAY SUBSTRATE, DISPLAY SUBSTRATE, AND DISPLAY APPARATUS

CROSS-REFERENCE TO RELATED APPLICATION

This application is a national stage application under 35 U.S.C. § 371 of International Application No. PCT/CN2019/102554, filed Aug. 26, 2019, which is a continuation-in-part of International Application No. PCT/CN2019/089421, filed May 31, 2019. Each of the forgoing applications is herein incorporated by reference in its entirety for all purposes.

TECHNICAL FIELD

The present invention relates to display technology, more particularly, to a method of fabricating a display substrate, a display substrate, and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including a light emitting layer, and a cathode. OLEDs can be either a bottom-emission type OLED or a top-emission type OLED.

SUMMARY

In one aspect, the present invention provides a method of fabricating a display substrate having a display area and a peripheral area, comprising forming a plurality of light emitting elements on a base substrate and in the display area; forming an encapsulating layer on a side of the plurality of light emitting elements distal to the base substrate to encapsulate the plurality of light emitting elements; forming an insulating layer, wherein the insulating layer is formed between the encapsulating layer and the base substrate; and forming a first barrier wall in the peripheral area and on a side of the insulating layer away from the base substrate, the first barrier wall forming a first enclosure substantially surrounding a first area; wherein the first barrier wall is formed to comprise a first lower portion in contact with the insulating layer and a first upper portion on a side of the first lower portion away from the insulating layer; an orthographic projection of the first upper portion on the base substrate covers an orthographic projection of the first lower portion on the base substrate; and the first barrier wall is formed so that a side of the first barrier wall away from the base substrate is wider than a side of the first barrier wall closer to the base substrate, along a width direction of the first barrier wall from the peripheral area to the display area.

Optionally, forming the first barrier wall comprises forming a negative photoresist material layer in the peripheral area and on a side of the insulating layer away from the base substrate; exposing the negative photoresist material layer using a mask plate having a light transmissive region corresponding to the first barrier wall to generate an exposed negative photoresist material layer; and developing the exposed negative photoresist material layer to form the first barrier wall; wherein the first barrier wall is formed to have an undercut profile.

Optionally, a lateral side of the first lower portion is substantially co-planar with a lateral side of the first upper portion.

Optionally, forming the first barrier wall comprises forming an image reversal photoresist material layer in the peripheral area and on a side of the insulating layer away from the base substrate; exposing the image reversal photoresist material layer using a mask plate having a light transmissive region corresponding to the first barrier wall to generate a first exposed photoresist material layer; reversal baking the first exposed photoresist material layer to generate a reversed photoresist material layer; exposing the reversed photoresist material layer to generate a second exposed photoresist material layer; and developing the second exposed photoresist material layer to form the first barrier wall; wherein the first barrier wall is formed to have an undercut profile.

Optionally, a lateral side of the first lower portion is substantially co-planar with a lateral side of the first upper portion.

Optionally, forming the first barrier wall comprises forming a first material layer in the peripheral area and on a side of the insulating layer away from the base substrate; forming a second material layer in the peripheral area and on a side of the first material layer away from the base substrate; and patterning the first material layer and the second material layer to form the first barrier wall.

Optionally, the first material layer is a first positive photoresist material layer and the second material layer is a second positive photoresist material layer; and the first positive photoresist material layer is more sensitive to exposure as compared to the second positive photoresist material layer; wherein forming the first barrier wall comprises forming the first positive photoresist material layer in the peripheral area and on a side of the insulating layer away from the base substrate; forming the second positive photoresist material layer in the peripheral area and on a side of the first positive photoresist material layer away from the base substrate; exposing the first positive photoresist material layer and the second positive photoresist material layer simultaneously using a mask plate having a light blocking region corresponding to the first barrier wall to generate an exposed first positive photoresist material layer and an exposed second positive photoresist material layer; and developing the exposed first positive photoresist material layer and the exposed second positive photoresist material layer to form the first barrier wall; wherein the first lower portion is generated by developing the exposed first positive photoresist material layer; the first upper portion is generated by developing the exposed second positive photoresist material layer; and a lateral side of the first lower portion is non-coplanar with a lateral side of the first upper portion.

Optionally, the first material layer is a positive photoresist material layer and the second material layer is a negative photoresist material layer; wherein forming the first barrier wall comprises forming the positive photoresist material layer in the peripheral area and on a side of the insulating layer away from the base substrate; forming the negative photoresist material layer in the peripheral area and on a side of the positive photoresist material layer away from the base substrate; exposing the negative photoresist material layer using a first mask plate having a light transmissive region corresponding to the first barrier wall to generate an exposed negative photoresist material layer; developing the exposed negative photoresist material layer to generate the first upper portion; exposing the positive photoresist material layer using a second mask plate having a light blocking region corresponding to the first barrier wall to generate an exposed positive photoresist material layer; and developing the exposed positive photoresist material layer to generate the first lower portion; wherein a lateral side of the first lower portion is non-coplanar with a lateral side of the first upper portion.

Optionally, the first material layer is a first negative photoresist material layer and the second material layer is a second negative photoresist material layer; and the second negative photoresist material layer is more sensitive to exposure as compared to the first negative photoresist material layer; wherein forming the first barrier wall comprises forming the first negative photoresist material layer in the peripheral area and on a side of the insulating layer away from the base substrate; forming the second negative photoresist material layer in the peripheral area and on a side of the first negative photoresist material layer away from the base substrate; exposing the first negative photoresist material layer and the second negative photoresist material layer simultaneously using a mask plate having a light transmissive region corresponding to the first barrier wall to generate an exposed first negative photoresist material layer and an exposed second negative photoresist material layer; and developing the exposed first negative photoresist material layer and the exposed second negative photoresist material layer to form the first barrier wall; wherein the first lower portion is generated by developing the exposed first negative photoresist material layer; the first upper portion is generated by developing the exposed second negative photoresist material layer; and a lateral side of the first lower portion is non-coplanar with a lateral side of the first upper portion.

Optionally, the first material layer is a metallic material layer and the second material layer is a photoresist material layer; and wherein forming the first barrier wall comprises forming the metallic material layer in the peripheral area and on a side of the insulating layer away from the base substrate; forming the photoresist material layer in the peripheral area and on a side of the metallic material layer away from the base substrate; exposing the photoresist material layer to generate an exposed photoresist material layer; developing the exposed photoresist material layer to form the first upper portion; and etching the metallic material layer to form the first lower portion.

Optionally, the first lower portion has a first side in contact with the insulating layer and a second side opposite to the first side, the first side and the second side being connected by the lateral side of the first lower portion; the first upper portion has a third side in contact with the first lower portion and a fourth side opposite to the third side, the third side and the fourth side being connected by the lateral side of the first upper portion; and the third side is wider than the first side and the second side along the width direction of the first barrier wall.

Optionally, the method further comprises forming a second barrier wall in the peripheral area and on a side of the insulating layer away from the base substrate, the second barrier wall forming a second enclosure substantially surrounding a second area; wherein the first barrier wall substantially surrounds the second barrier wall.

Optionally, the method further comprises punching an aperture through the display substrate to form a window region; wherein the window region is substantially surrounded by the first enclosure.

Optionally, the method further comprises forming an inorganic blocking layer covering the first barrier wall; the inorganic blocking layer is limited in the peripheral area; and the inorganic blocking layer is formed to be in direct contact with the first barrier wall and the insulating layer.

Optionally, the method further comprises forming one or a combination of an organic material layer and a cathode layer on a side of the inorganic blocking layer away from the base substrate, isolated into discontinued portions by lateral sides of the first barrier wall.

Optionally, the method further comprises forming a crack prevention layer in an angled space between a lateral side of the first barrier wall and a surface of the insulating layer.

Optionally, forming the crack prevention layer comprises forming a positive photoresist material layer on a side of the first barrier wall away from the base substrate; and patterning the positive photoresist material layer to form the crack prevention layer; wherein the positive photoresist material layer is removed during the patterning the positive photoresist material layer, except for a portion in the angled space between the lateral side of the first barrier wall and the surface of the insulating layer, thereby forming the crack prevention layer.

In another aspect, the present invention provides a display substrate having a display area and a peripheral area, comprising a base substrate; a plurality of light emitting elements on the base substrate and in the display area; an encapsulating layer on a side of the plurality of light emitting elements distal to the base substrate to encapsulate the plurality of light emitting elements; an insulating layer between the encapsulating layer and the base substrate; and a first barrier wall in the peripheral area and on a side of the insulating layer away from the base substrate, the first barrier wall forming a first enclosure substantially surrounding a first area; wherein the first barrier wall comprises a first lower portion in contact with the insulating layer and a first upper portion on a side of the first lower portion away from the insulating layer; an orthographic projection of the first upper portion on the base substrate covers an orthographic projection of the first lower portion on the base substrate; and a side of the first barrier wall away from the base substrate is wider than a side of the first barrier wall closer to the base substrate, along a width direction of the first barrier wall from the peripheral area to the display area.

Optionally, a lateral side of the first lower portion is non-coplanar with a lateral side of the first upper portion; the first lower portion has a first side in contact with the insulating layer and a second side opposite to the first side, the first side and the second side being connected by the lateral side of the first lower portion; the first upper portion has a third side in contact with the first lower portion and a fourth side opposite to the third side, the third side and the fourth side being connected by the lateral side of the first upper portion; and the third side is wider than the first side and the second side along the width direction of the first barrier wall.

Optionally, the display substrate further comprises a second barrier wall in the peripheral area and on a side of the insulating layer away from the base substrate, the second barrier wall forming a second enclosure substantially surrounding a second area; wherein the first barrier wall substantially surrounds the second barrier wall.

Optionally, the first enclosure substantially surrounds a window region of the display substrate; and the display substrate has an aperture extending through the window region for installing an accessory therein.

Optionally, the display substrate further comprises an inorganic blocking layer covering the first barrier wall; the inorganic blocking layer is limited in the peripheral area; and the inorganic blocking layer is in direct contact with the first barrier wall, the crack prevention layer, and the insulating layer.

Optionally, the display substrate further comprises one or a combination of an organic material layer and a cathode layer on a side of the inorganic blocking layer away from the base substrate, isolated into discontinued portions by lateral sides of the first barrier wall.

Optionally, the display substrate further comprises a crack prevention layer in an angled space between a lateral side of the first barrier wall and a surface of the insulating layer.

Optionally, the first barrier wall comprises a first lower portion in contact with the insulating layer and a first upper portion on a side of the first lower portion away from the insulating layer; an orthographic projection of the first upper portion on the base substrate covers an orthographic projection of the first lower portion on the base substrate; a first lateral side of the first lower portion forms a first angled space with a surface of the insulating layer; a second lateral side of the first lower portion forms a second angled space with the surface of the insulating layer; and the crack prevention layer comprises a first crack prevention sub-layer in the first angled space and a second crack prevention sub-layer in the second angled space.

Optionally, the first barrier wall comprises a negative photoresist material; and the crack prevention layer comprises a positive photoresist material.

Optionally, the first portion comprises a positive photoresist material; and the second portion comprises a positive photoresist material.

Optionally, the first portion comprises a positive photoresist material; and the second portion comprises a negative photoresist material.

Optionally, the first portion comprises a negative photoresist material; and the second portion comprises a negative photoresist material.

Optionally, the first portion comprises a metallic material; and the second portion comprises a photoresist material.

In another aspect, the present invention provides a display apparatus, comprising the display substrate described herein or fabricated by a method described herein, and one or more integrated circuits connected to the display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
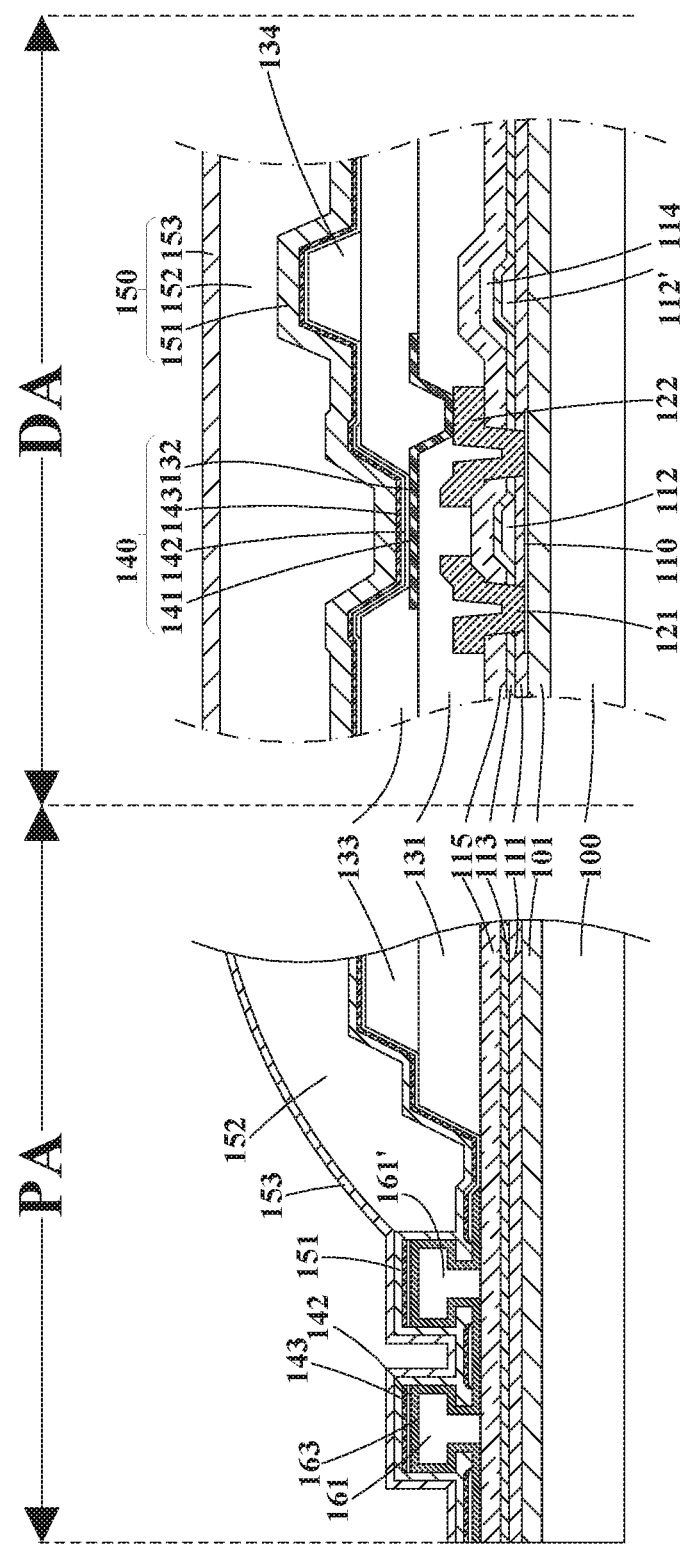
FIG. 1A is a cross-sectional view of a portion of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

It is discovered in the present disclosure that a display panel or a display substrate is particularly prone to moist and oxygen permeation in a window region formed to install an accessory such as a camera. The window region is typically formed by punching a hole through the display substrate. Thus, the encapsulating layer may not be able to encapsulate the display substrate once the window region is formed. Particularly, a fabrication process of an organic light emitting diode display substrate often adopts an open mask process to deposit one or more organic material layer and electrode layer, e.g., without any patterning steps. The encapsulating layer in the window region cannot satisfactorily encapsulate these organic material layer and electrode layer, leading to exposure of the display substrate to external oxygen and moist. Further, the process of forming the window region potentially may produce cracks in a boundary adjacent to the window region. The cracks may propagate into the display area of the display substrate, further adversely affect the display components inside the display area.

Accordingly, the present disclosure provides, inter cilia, a method of fabricating a display substrate, a display substrate, and a display apparatus that substantially obviate one or more of the problems due to limitations and disadvantages of the related art. In one aspect, the present disclosure provides a display substrate having a display area and a peripheral area. In some embodiments, the display substrate includes a base substrate; a plurality of light emitting elements on the base substrate and in the display area; an encapsulating layer on a side of the plurality of light emitting elements distal to the base substrate to encapsulate the plurality of light emitting elements; an insulating layer between the encapsulating layer and the base substrate; and a first barrier wall in the peripheral area and on a side of the insulating layer away from the base substrate, the first barrier wall forming a first enclosure substantially surrounding a first area. Optionally, the first barrier wall includes a first lower portion in contact with the insulating layer and a first upper portion on a side of the first lower portion away from the insulating layer. Optionally, an orthographic projection of the first upper portion on the base substrate covers an orthographic projection of the first lower portion on the base substrate. Optionally, a side of the first barrier wall away from the base substrate is wider than a side of the first barrier wall closer to the base substrate, along a width direction of the first barrier wall from the peripheral area to the display area.

As used herein, the term "display area" refers to an area of a display substrate (e.g., an opposing substrate or an array substrate) in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display substrate (e.g., an opposing substrate or an array substrate) in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display areas.

As used herein the term "substantially surrounding" refers to surrounding at least 50% (e.g., at least 60%, at least 70%, at least 80%, at least 90%, at least 95%, at least 99%, and 100%) of a perimeter of an area.

Various appropriate light emitting elements may be used in the present display substrate. Examples of appropriate light emitting elements include organic light emitting diodes, quantum dots light emitting diodes, and micro light emitting diodes.

Figure 1B:
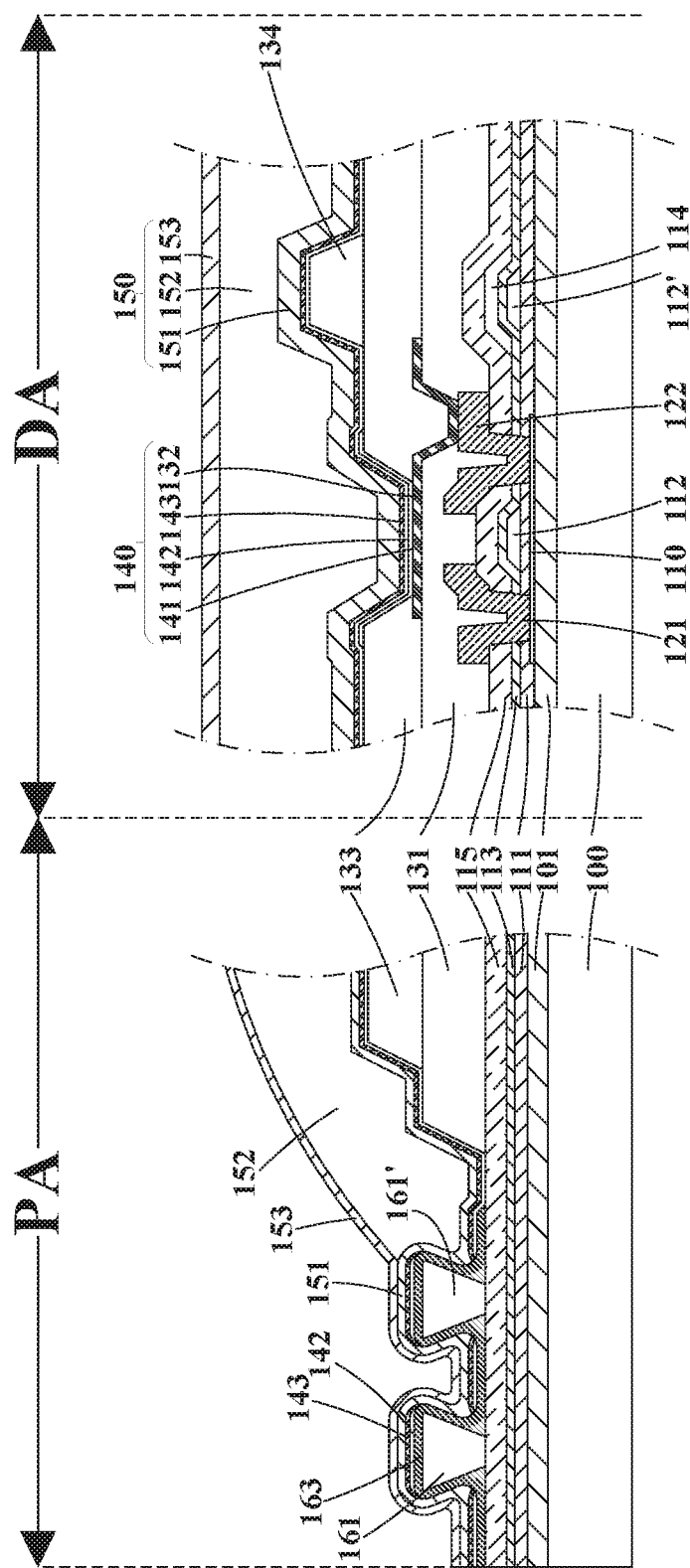
FIG. 1B is a cross-sectional view of a portion of a display substrate in some embodiments according to the present disclosure.

FIG. 1A is a cross-sectional view of a portion of a display substrate in some embodiments according to the present disclosure. FIG. 1B is a cross-sectional view of a portion of a display substrate in some embodiments according to the present disclosure. Referring to FIG. 1A and FIG. 1B, the display substrate in some embodiments has a display area DA and a peripheral area PA. In some embodiments, the display substrate includes a base substrate 100 a plurality of light emitting elements 140 on the base substrate 100 and in the display area DA; an encapsulating layer 150 on a side of the plurality of light emitting elements 140 distal to the base substrate 100 to encapsulate the plurality of light emitting elements 140; an insulating layer 115 on the base substrate 100 and a first barrier wall 161 in the peripheral area PA and on a side of the insulating layer 115 away from the base substrate 100, the first barrier wall 161 forming a first enclosure substantially surrounding a first area.

Figure 2A:
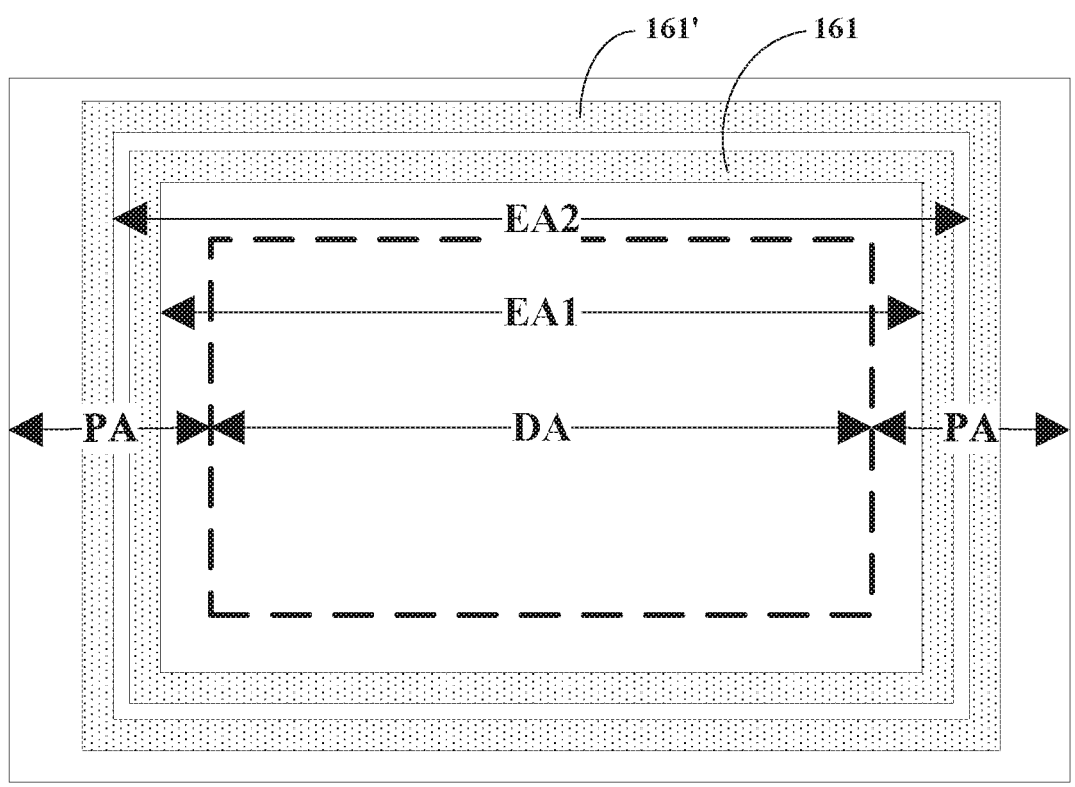
FIG. 2A is a plan view of a display substrate in some embodiments according to the present disclosure.

FIG. 2A is a plan view of a display substrate in some embodiments according to the present disclosure. Referring to FIG. 2A, the first enclosure formed by the first barrier wall 161 in the peripheral area PA substantially surrounds a first area EA1. The first enclosure substantially surrounds the display area DA, and the first area EA1 has an area equal to or greater than an area of the display area DA.

Figure 2B:
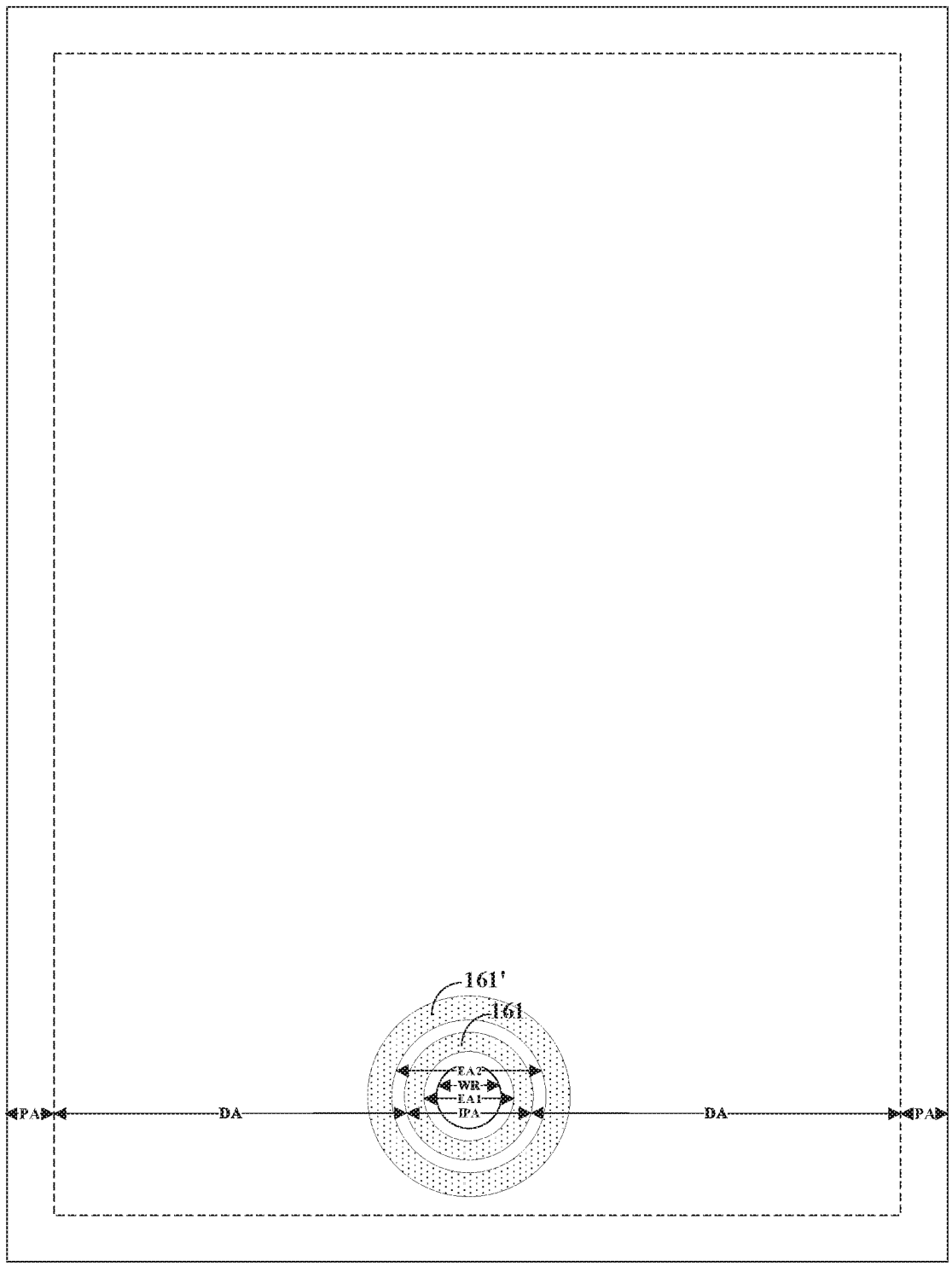
FIG. 2B is a plan view of a display substrate in some embodiments according to the present disclosure.

FIG. 2B is a plan view of a display substrate in some embodiments according to the present disclosure. Referring to FIG. 2B, the display substrate has a substantially rectangular shape. In some embodiments, the first enclosure formed by the first barrier wall 161 in the peripheral area PA substantially surrounds a first area EA1. The first enclosure does not surround the display area DA, but substantially surrounds an inner peripheral area IPA which is substantially surrounded by the display area DA. The inner peripheral area IPA has an area equal to or greater than an area of the first area EA1. Optionally, the peripheral area PA includes the inner peripheral area IPA. Optionally, the first enclosure substantially surrounds a window region WR of the display substrate, the display substrate has an aperture extending through the window region WR for installing an accessory (e.g., a camera lens, a fingerprint sensor) therein. Optionally, the first area EA1 has an area equal to or greater than an area of the window region WR.

Figure 2C:
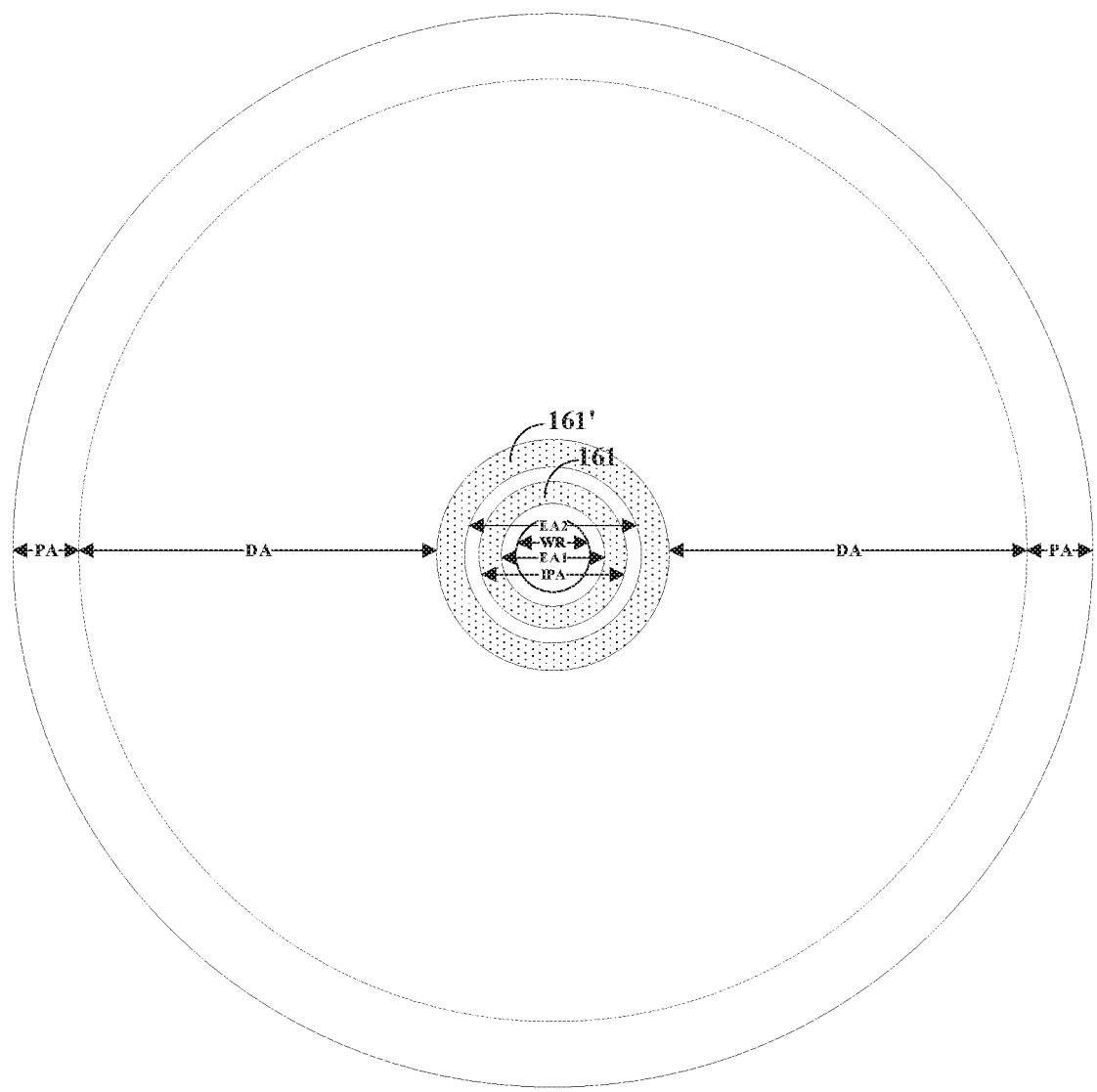
FIG. 2C is a plan view of a display substrate in some embodiments according to the present disclosure.

FIG. 2C is a plan view of a display substrate in some embodiments according to the present disclosure. Referring to FIG. 2C, the display substrate has a substantially circular shape. In some embodiments, the first enclosure formed by the first barrier wall in the peripheral area PA substantially surrounds a first area EA1. The first enclosure does not surround the display area DA, but substantially surrounds an inner peripheral area. IPA which is substantially surrounded by the display area DA. The inner peripheral area IPA has an area equal to or greater than an area of the first area EA1. Optionally, the peripheral area PA includes the inner peripheral area IRA. Optionally, the first enclosure substantially surrounds a window region WR of the display substrate, the display substrate has an aperture extending through the window region WR for installing an accessory (e.g., a camera lens, a fingerprint sensor) therein. Optionally, the first area EA1 has an area equal to or greater than an area of the window region WR.

Figure 3A:
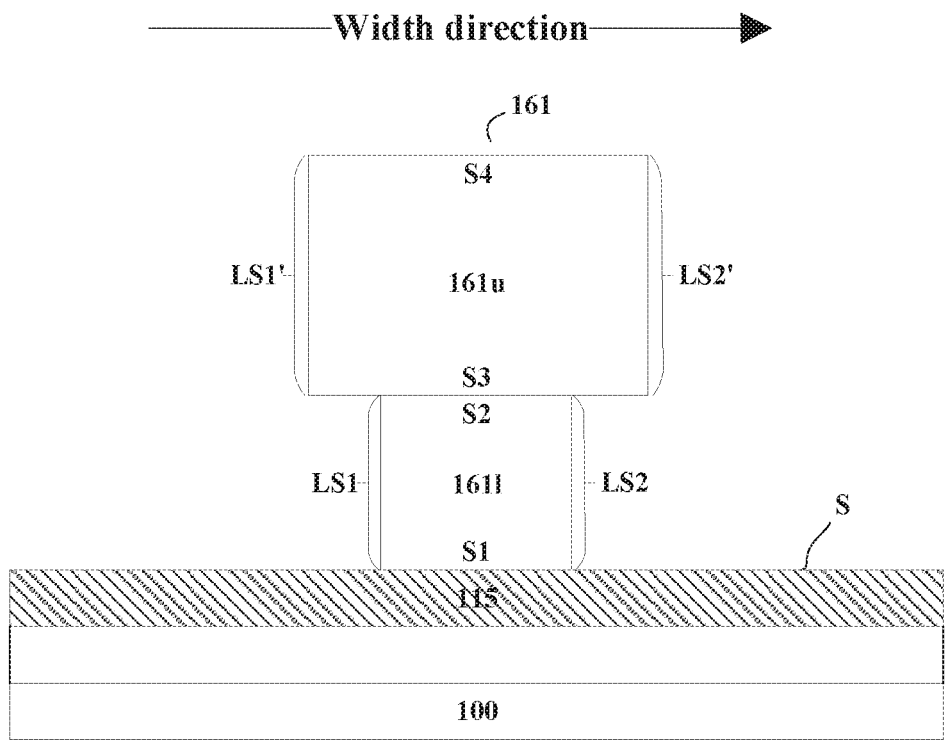
FIG. 3A is a schematic diagram illustrating the structure of a first barrier wall in some embodiments according to the present disclosure.
Figure 3B:
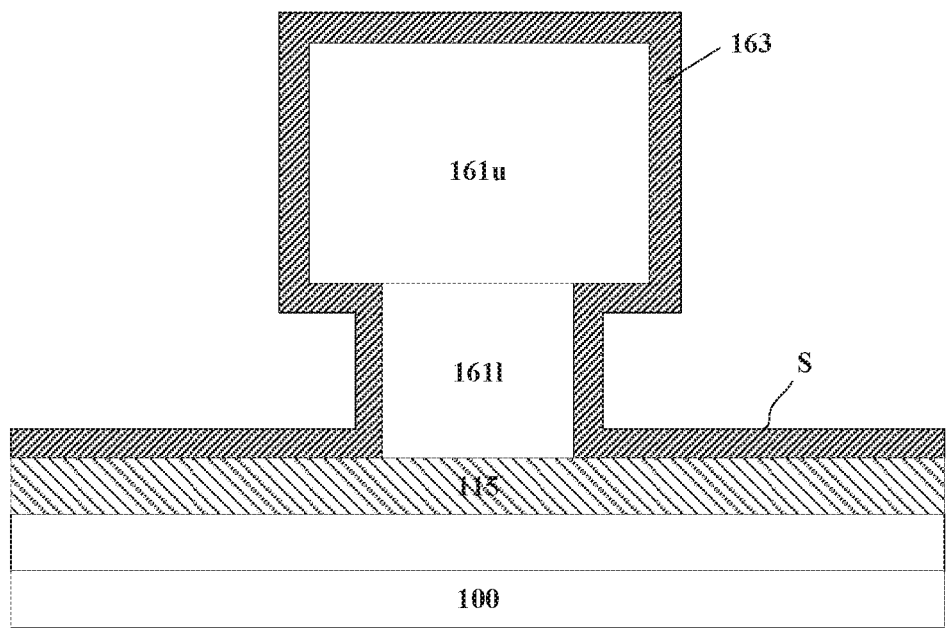
FIG. 3B is a schematic diagram illustrating the structure of a first barrier wall and an inorganic blocking layer in some embodiments according to the present disclosure.
Figure 3C:
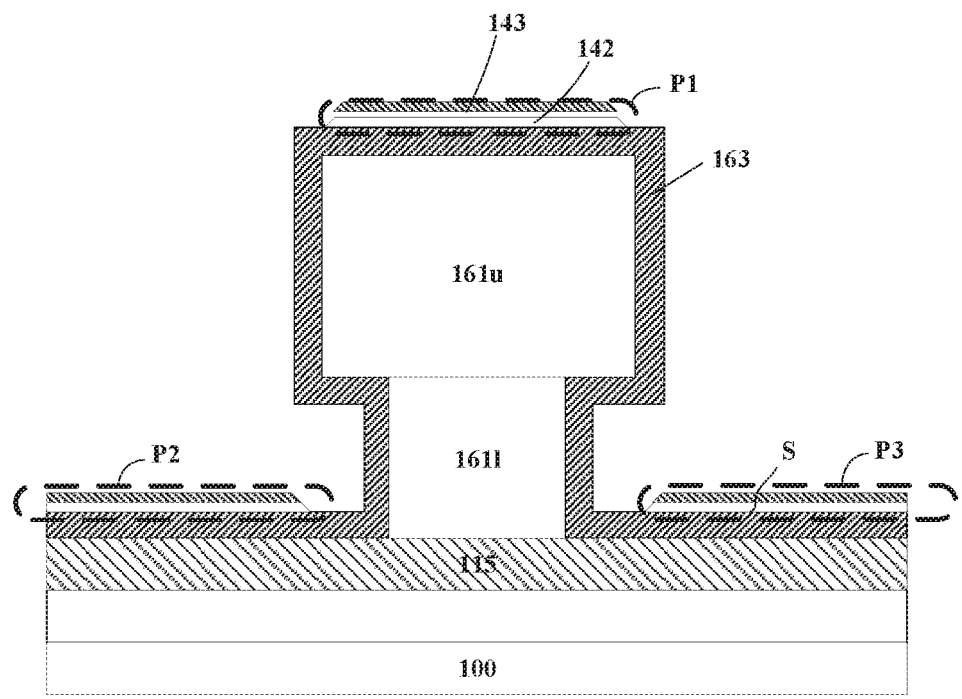
FIG. 3C is a schematic diagram illustrating the structure of an organic material layer and a cathode layer on a first barrier wall in some embodiments according to the present disclosure.

Referring to FIG. 1A and FIG. 1B, in some embodiments, the first barrier wall is formed to have an undercut profile. FIG. 3A is a schematic diagram illustrating the structure of a first barrier wall in some embodiments according to the present disclosure. FIG. 3B is a schematic diagram illustrating the structure of a first barrier wall and an inorganic blocking layer in some embodiments according to the present disclosure. FIG. 3C is a schematic diagram illustrating the structure of an organic material layer and a cathode layer on a first barrier wall in some embodiments according to the present disclosure. Referring to FIG. 3A, the first barrier wall 161 in some embodiments includes a first lower portion 161$l$ in contact with the insulating layer 115 and a first upper portion 161$u$ on a side of the first lower portion 161$l$ away from the insulating layer 115. An orthographic projection of the first upper portion 161$u$ on the base substrate 100 covers an orthographic projection of the first lower portion 161$l$ on the base substrate 100. Optionally, a width of the first upper portion 161$u$ along a direction from the first lateral side LS1' to the second lateral side LS2' is greater than a width of the first lower portion 161$l$ along the direction from the first lateral side LS1 to the second lateral side LS2. Optionally, a minimum width of the first upper portion 161$u$ along the direction from the first lateral side LS1' to the second lateral side LS2' is equal to or greater than a maximum width of the first lower portion 161$l$ along the direction from the first lateral side LS1 to the second lateral side LS2. Optionally, a side (e.g., a top side) of the first upper portion 161$u$ away from the base substrate 100 is wider than a side (e.g., a bottom side) of the first upper portion 161$u$ closer to the base substrate 100. Optionally, a side (e.g., a top side) of the first lower portion 161$l$ away from the base substrate 100 is wider than a side (e.g., a bottom side) of the first lower portion 161$l$ closer to the base substrate 100.

As used herein, the term "lateral side" is used in its ordinary sense and refers without limitation to a side connecting a top side and a bottom side, for example, a side connecting a top side of the first lower portion 161$l$ away from the base substrate 100 and a bottom side of the first lower portion 161$l$ closer to the base substrate 100. In one example, the lateral side is a side rising on the sides from a bottom surface.

In some embodiments, as shown in FIG. 3A, a lateral side of the first lower portion 161$l$ is non-coplanar with a lateral side of the first upper portion 161$u$. Optionally, the first lower portion 161$l$ has a first side S1 (the bottom side) in contact with the insulating layer 115 and a second side S2 (the top side) opposite to the first side S1, the first side S1 and the second side S2 being connected by the lateral side (LS1 or LS2) of the first lower portion 161$l$. Optionally, the first upper portion 161$u$ has a third side S3 (the bottom side) in contact with the first lower portion 161$l$ and a fourth side S4 (the top side) opposite to the third side S4, the third side S3 and the fourth side S4 being connected by the lateral side (LS1' or LS2') of the first upper portion 161$u$. Optionally, the third side S3 is wider than the first side S1 and the second side S2 along the width direction of the first barrier wall 161. As used herein, the term "non-coplanar" refers to two or more surfaces on a structure being offset more than 100 nm (e.g., more than 110 nm, more than 120 nm, more than 130 nm, more than 140 nm, more than 150 nm, more than 160 nm, more than 170 nm, more than 180 nm, more than 190 nm, more than 200 nm, or more than 500 nm) from sharing a same common plane.

Referring to FIG. 1A and FIG. 3B, the display substrate in some embodiments further includes an inorganic blocking layer 163 covering the first barrier wall 161. Optionally, the inorganic blocking layer 163 is limited in the peripheral area PA. Optionally, the inorganic blocking layer 163 is in direct contact with the first barrier wall 161. Optionally, the inorganic blocking layer 163 further extends into regions outside the first barrier wall 161, and is in direct contact with the insulating layer 115.

Specifically, referring to FIGS. 3A to 3B, the inorganic blocking layer 163 covers and optionally is in direct contact with a top surface (e.g., a surface away from the base substrate 100) of the first upper portion 161$u$. The inorganic blocking layer 163 further covers and optionally is in direct contact with lateral sides of the first upper portion 161$u$. The inorganic blocking layer 163 further covers and optionally is in direct contact with the lateral side of the first lower portion 161$l$.

Referring to FIG. 1A and FIG. 3C, in some embodiments, the display substrate further includes one or a combination of an organic material layer 142 (e.g., an organic light emitting layer) and a cathode layer 143 on a side of the inorganic blocking layer 163 away from the base substrate 100, isolated into discontinued portions by lateral sides of the first barrier wall 161. For example, FIG. 3C shows a first portion P1, a second portion P2, and a third portion P3 that are isolated into discontinued portions by lateral sides of the first barrier wall 161. The first portion P1 is on a side of the first barrier wall 161 away from the base substrate 100, an orthographic projection of the first portion P1 on the base substrate 100 at least partially overlaps with an orthographic projection of the first barrier wall 161 on the base substrate 100. The second portion P2 and the third portion P3 are on a side of the inorganic blocking layer 163 away from the base substrate 100, orthographic projections of the second portion P2 and the third portion P3 on the base substrate 100 are substantially non overlapping (e.g., completely non-overlapping) with the orthographic projection of the first barrier wall 161 on the base substrate 100. As used herein, the term "substantially non-overlapping" refers to two orthographic projections being at least 50 percent (e.g., at least 60%, at least 70%, at least 80%, at least 90%, at least 95%, at least 99%, and 100%) non-overlapping.

The organic material layer 142 and the cathode layer 143 may be formed in a same process for forming an organic material layer 142 and a cathode layer 143 for the plurality of light emitting elements 140 in the display area DA. For example, in some embodiments, the organic material layer 142 and the cathode layer 143 for the plurality of light emitting elements 140 are respectively formed in an open mask deposition process, in which no mask plate is used and the target material is deposited onto an entire surface of the substrate. By having a first barrier wall 161 that is wider on top and narrower on bottom, the organic material layer 142 and the cathode layer 143 can be isolated into discontinued portions.

Optionally, the organic material layer 142 includes at least one of an organic light emitting layer, a hole transport layer, a hole injection layer, an electron transport layer, an electron injection layer, or any other organic functional layer in the plurality of light emitting element 140. Optionally, the organic material layer 142 includes at least one of an electron transport layer or an electron injection layer, but does not include an organic light emitting layer (which is not formed in an open mask process).

Referring to FIG. 1A and FIG. 1B, in some embodiments, the encapsulating layer 150 includes a first inorganic encapsulating sub-layer 151, an organic encapsulating sub-layer 152, and a second inorganic encapsulating sub-layer 153. In some embodiments, at least one inorganic sub-layer of the encapsulating layer 150 extends from the display area DA into the peripheral area PA. In one example, the first inorganic encapsulating sub-layer 151 and the second inorganic encapsulating sub-layer 153 extend from the display area DA into the peripheral area PA. Optionally, each of the first inorganic encapsulating sub-layer 151, the organic encapsulating sub-layer 152, and the second inorganic encapsulating sub-layer 153 extends from the display area DA into the peripheral area PA. Optionally, the at least one inorganic sub-layer of the encapsulating layer 150 is on a side of the inorganic blocking layer 163 away from the base substrate 100. Optionally, the at least one inorganic sub-layer of the encapsulating layer 150 is on a side of the first barrier wall 161 away from the base substrate 100.

In one example, the at least one inorganic sub-layer of the encapsulating layer 150 (e.g., one or both of the first inorganic encapsulating sub-layer 151 and the second inorganic encapsulating sub-layer 153) completely covers a portion of the inorganic blocking layer 163 covering the lateral sides of the first barrier wall 161.

The display substrate in some embodiments may include any appropriate numbers of barrier walls, each forming an enclosure substantially surrounding an area (e.g., a window region or a display area as discussed in FIG. 2A and FIG. 2B). Optionally, the display substrate may include a total number of 1-20 barrier walls. In some embodiments, as shown in FIG. 1A, FIG. 1B, FIG. 2A, and FIG. 2B, the display substrate further includes a second barrier wall 161' in the peripheral area PA and on a side of the insulating layer 115 away from the base substrate 100. The second barrier wall 161' forms a second enclosure substantially surrounding a second area EA2. Optionally, the second area EA2 encloses the first area EA1.

Figure 4A:
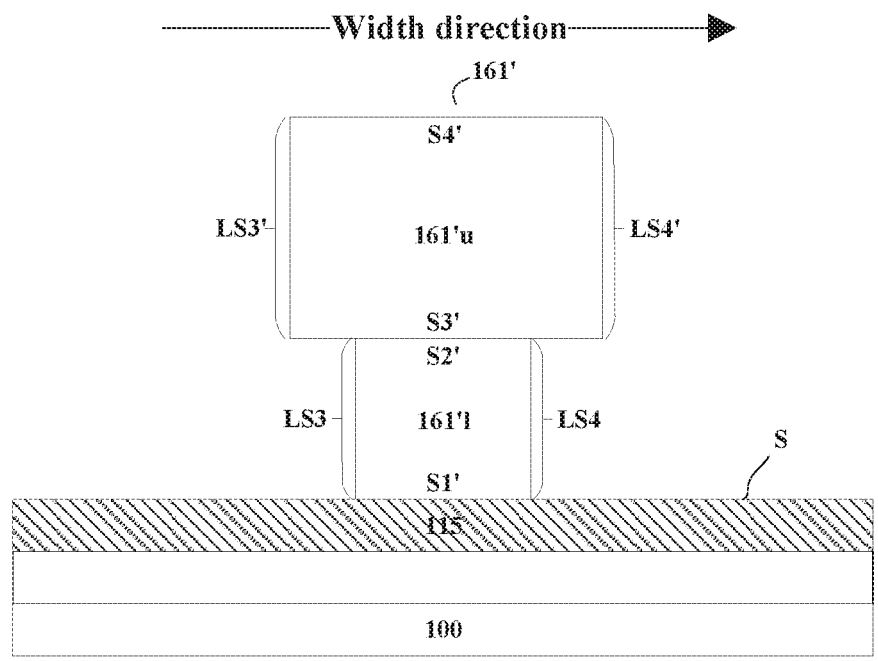
FIG. 4A is a schematic diagram illustrating the structure of a second barrier wall in some embodiments according to the present disclosure.
Figure 4B:
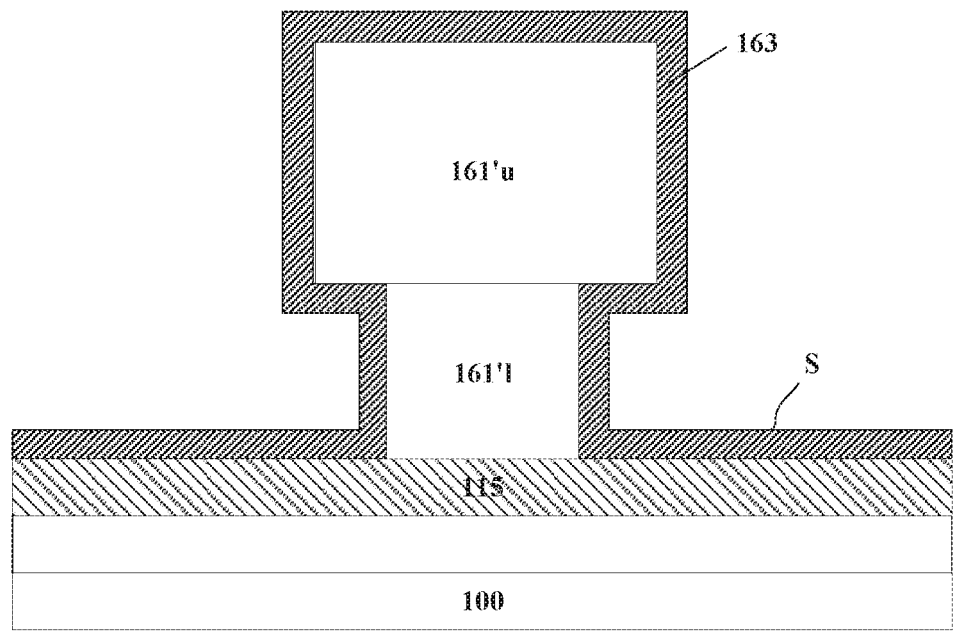
FIG. 4B is a schematic diagram illustrating the structure of a second barrier wall and an inorganic blocking layer in some embodiments according to the present disclosure.
Figure 4C:
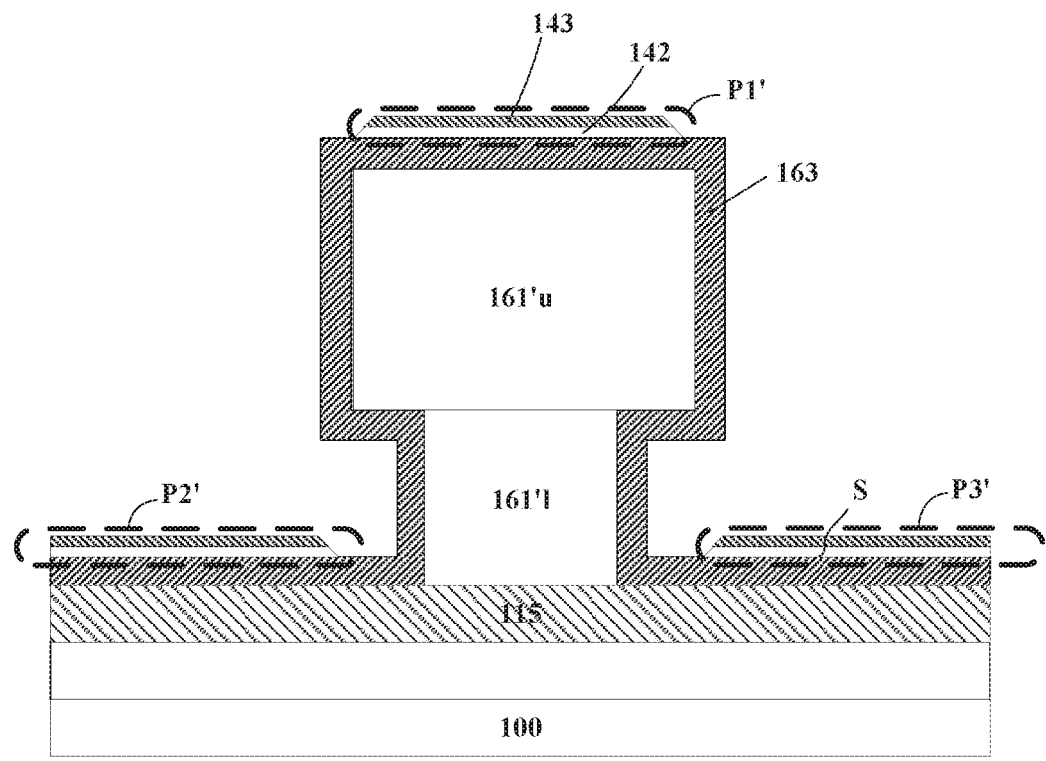
FIG. 4C is a schematic diagram illustrating the structure of an organic material layer and a cathode layer on a second barrier wall in some embodiments according to the present disclosure.

The second barrier wall 161' in some embodiments has a structure similar to that of the first barrier wall 161. FIG. 4A is a schematic diagram illustrating the structure of a second barrier wall in some embodiments according to the present disclosure. FIG. 4B is a schematic diagram illustrating the structure of a second barrier wall and an inorganic blocking layer in some embodiments according to the present disclosure. FIG. 4C is a schematic diagram illustrating the structure of an organic material layer and a cathode layer on a second barrier wall in some embodiments according to the present disclosure. Referring to FIGS. 1A, 4A to 4C, in some embodiments, the second barrier wall 161' includes a second lower portion 161'l in contact with the insulating layer 115 and a second upper portion 161'u on a side of the second lower portion 161'l away from the insulating layer 115. Optionally, an orthographic projection of the second upper portion 161'u on the base substrate 100 covers an orthographic projection of the second lower portion 161'l on the base substrate 100.

In some embodiments, as shown in FIG. 4A, a lateral side of the second lower portion 161'l is non-coplanar with a lateral side of the second upper portion 161'u. Optionally, the second lower portion 161'l has a first side S1' (the bottom side) in contact with the insulating layer 115 and a second side S2' (the top side) opposite to the first side S1', the first side S1' and the second side S2' being connected by the lateral side (LS3 or LS4) of the second lower portion 161'l. Optionally, the second upper portion 161'u has a third side S3' (the bottom side) in contact with the second lower portion 161'l and a fourth side S4' (the top side) opposite to the third side S4', the third side S3' and the fourth side S4' being connected by the lateral side (LS3' or LS4') of the second upper portion 161'u. Optionally, the third side S3' is wider than the first side S1' and the second side S2' along the width direction of the second barrier wall 161'.

In some embodiments, a side of the second upper portion 161'u away from the base substrate 100 is wider than a side of the second upper portion 161'u closer to the base substrate 100; and a side of the second lower portion 161'l away from the base substrate 100 is wider than a side of the second lower portion 161'l closer to the base substrate 100.

In some embodiments, the inorganic blocking layer 163 substantially covers the first barrier wall 161, the second barrier wall 161', and any region between the first barrier wall 161 and the second barrier wall 161'. The inorganic blocking layer 163 is limited in the peripheral area PA. Optionally, the inorganic blocking layer 163 is in direct contact with the first barrier wall 161, the second barrier wall 161', and the insulating layer 115. Optionally, the inorganic blocking layer 163 completely covers lateral sides of the second barrier wall 161'.

In some embodiments, one or a combination of the organic material layer 142 and the cathode layer 143 are on a side of the inorganic blocking layer 163 away from the base substrate 100, isolated into discontinued portions by lateral sides of the second barrier wall 161'. For example, FIG. 4C shows a fourth portion P1', a fifth portion P2', and a sixth portion P3' that are isolated into discontinued portions by lateral sides of the second barrier wall 161'. The fourth portion P1' is on a side of the second barrier wall 161' away from the base substrate 100, an orthographic projection of the fourth portion P1' on the base substrate 100 at least partially overlaps with an orthographic projection of the second barrier wall 161' on the base substrate 100. The fifth portion P2' and the sixth portion P3' are on a side of the inorganic blocking layer 163 away from the base substrate 100, orthographic projections of the fifth portion P2' and the sixth portion P3' on the base substrate 100 are substantially non-overlapping (e.g., completely non-overlapping) with the orthographic projection of the second barrier wall 161' on the base substrate 100.

In some embodiments, at least one inorganic sub-layer of the encapsulating layer 150 (e.g., one or both of the first inorganic encapsulating sub-layer 151 and the second inorganic encapsulating sub-layer 153) is on a side of the inorganic blocking layer 163 away from the base substrate 100. Optionally, the at least one inorganic sub-layer of the encapsulating layer 150 is on a side of the second barrier wall 161' away from the base substrate 100. Optionally, the at least one inorganic sub-layer of the encapsulating layer 150 (e.g., one or both of the first inorganic encapsulating sub-layer 151 and the second inorganic encapsulating sub-layer 153) completely covers a portion of the inorganic blocking layer 163 covering the lateral sides of the second barrier wall 161'.

Optionally, each of the first enclosure and the second enclosure substantially surrounds a window region of the display substrate, and the display substrate has an aperture extending through the window region for installing an accessory therein. Examples of accessories that may be installed in the window region include an earpiece, a camera, a photosensor, a distance sensor, an infrared sensor, a fingerprint sensor, an acoustic sensor, an indicator, a button, a knob, or any combination thereof.

In some embodiments, each of the first barrier wall 161 and the second barrier wall 161' has a thickness in a range of 0.5 μm to 5 μm. Optionally, each of the first barrier wall 161 and the second barrier wall 161' has a width in a range of 2 μm to 100 μm.

Various appropriate materials and various appropriate fabricating methods may be used to make the first barrier wall 161 and the second barrier wall 161'. For example, an insulating material may be deposited by a plasma-enhanced chemical vapor deposition (PECVD) process or a sputtering process, e.g., a magnetron sputtering process. The deposited insulating material layer is then patterned, e.g., by a lithographic process. Optionally, each of the first barrier wall 161 and the second barrier wall 161' is made of a negative photoresist material. The first barrier wall 161 and the second barrier wall 161' may be formed by forming a negative photoresist material layer in the peripheral area and on a side of the insulating layer away from the base substrate; and patterning the negative photoresist material layer to form the first barrier wall and the second barrier wall. Due to the property of the negative photoresist material, exposure and development of the negative photoresist material results in an undercut profile of the first barrier wall 161 or the second barrier wall 161', e.g., a side of the first barrier wall 161 or the second barrier wall 161' away from the base substrate 100 is wider than a side of the first barrier wall 161 or the second barrier wall 161' closer to the base substrate 100.

In some embodiments, the inorganic blocking layer 163 has a thickness in a range of 10 nm to 3 μm. Various appropriate materials and various appropriate fabricating methods may be used to make the inorganic blocking layer 163. For example, an insulating material may be deposited by a plasma-enhanced chemical vapor deposition (PECVD) process or a sputtering process, e.g., a magnetron sputtering process. The deposited insulating material layer is then patterned, e.g., by a lithographic process, Examples of appropriate insulating material for making the inorganic blocking layer 163 include silicon oxide, silicon nitride, silicon oxynitride, aluminum oxide, and any combination thereof.

Referring to FIG. 1A and FIG. 1B, in some embodiments, the display substrate further includes a barrier layer 101 on the base substrate 100, and a plurality of thin film transistors in the display area DA and on a side of the barrier layer away from the base substrate 100. A respective one of the plurality of thin film transistors includes an active layer 110 on the barrier layer 101, a first gate insulating layer 111 on a side of the active layer 110 away from the base substrate 100, a gate electrode 112 on a side of the first gate insulating layer 111 away from the base substrate 100, the insulating layer 115 on a side of the gate electrode 112 away from the base substrate 100, a source electrode 121 and a drain electrode 122 on a side of the insulating layer 115 away from the base substrate 100. Optionally, the display substrate further includes a second gate insulating layer 113 between the first gate insulating layer 111 and the insulating layer 115. Optionally, the display substrate further includes a first electrode 112' and a second electrode 114. The second gate insulating layer 113 spaces apart the first electrode 112' and a second electrode 114 from each other. The first electrode 112', the second gate insulating layer 113, and a second electrode 114 form a capacitor.

A respective one of the plurality of light emitting elements 140 includes an anode 132, a light emitting layer 141 on the anode 132, the organic material layer 142 on a side of the light emitting layer 141 away from the base substrate 100, the cathode layer 143 on a side of the organic material layer 142 away from the base substrate 100. Optionally, the organic material layer 142 and the cathode layer 143 can be formed in an open mask process.

In some embodiments, the display substrate further includes a planarization layer 131 on a side of the plurality of thin film transistors away from the base substrate 100. The anode 132 is electrically connected to the drain electrode 122 of the respective one of the plurality of thin film transistor through a via extending through the planarization layer 131.

In some embodiments, the display substrate further includes a pixel definition layer 133 on a side of the planarization layer 131 away from the base substrate 100. The pixel definition layer 133 defines a plurality of subpixel apertures for receiving the light emitting layer 141.

In some embodiments, the display substrate further includes a spacer 134 on the pixel definition layer 133.

Figure 5A:
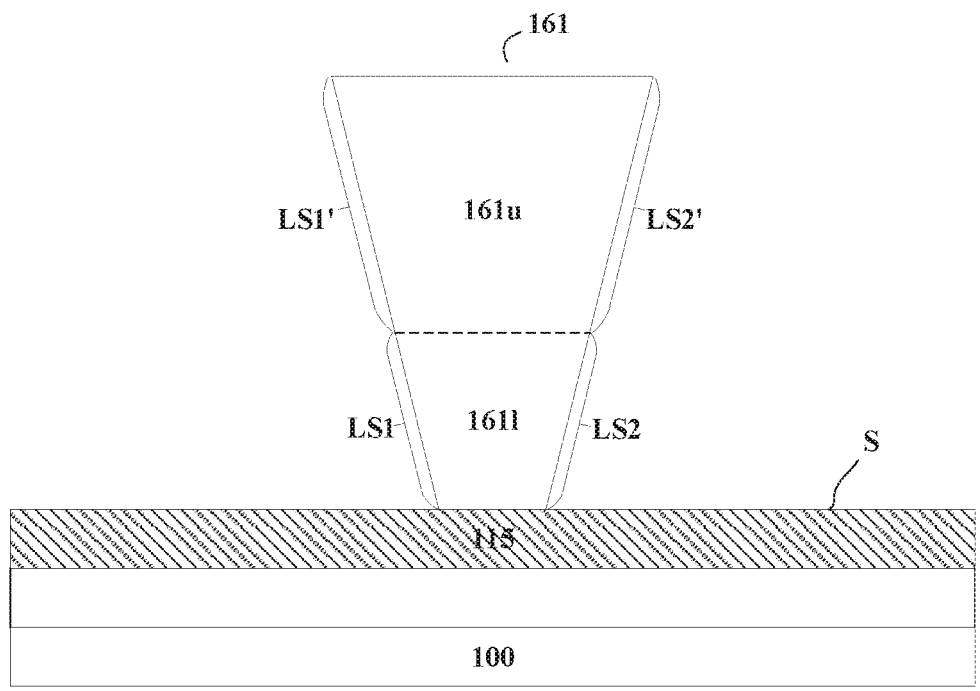
FIG. 5A is a schematic diagram illustrating the structure of a first barrier wall in some embodiments according to the present disclosure.
Figure 5B:
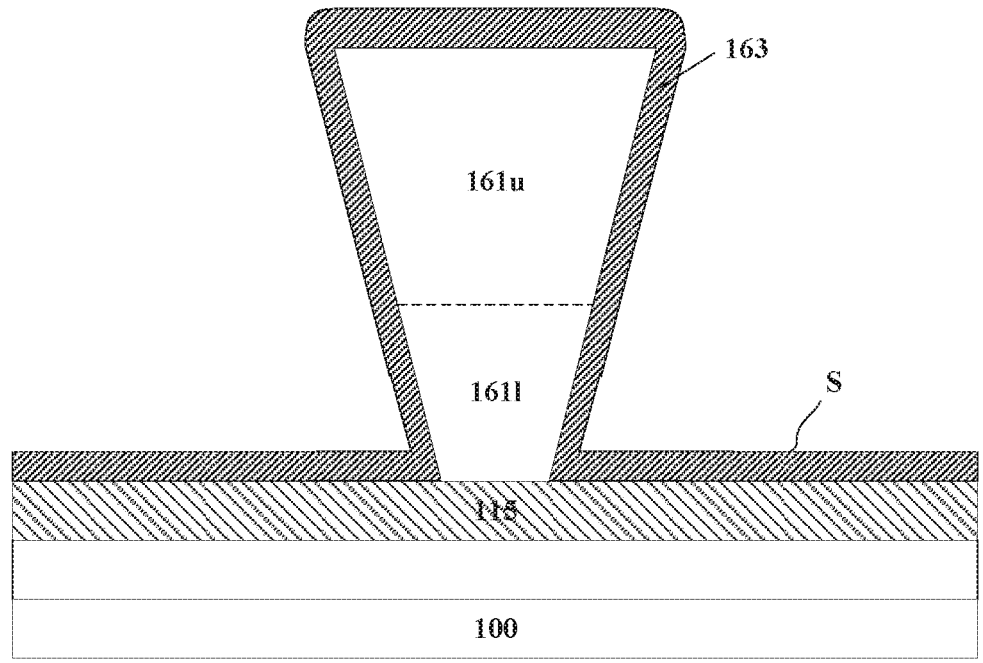
FIG. 5B is a schematic diagram illustrating the structure of a first barrier wall and an inorganic blocking layer in some embodiments according to the present disclosure.
Figure 5C:
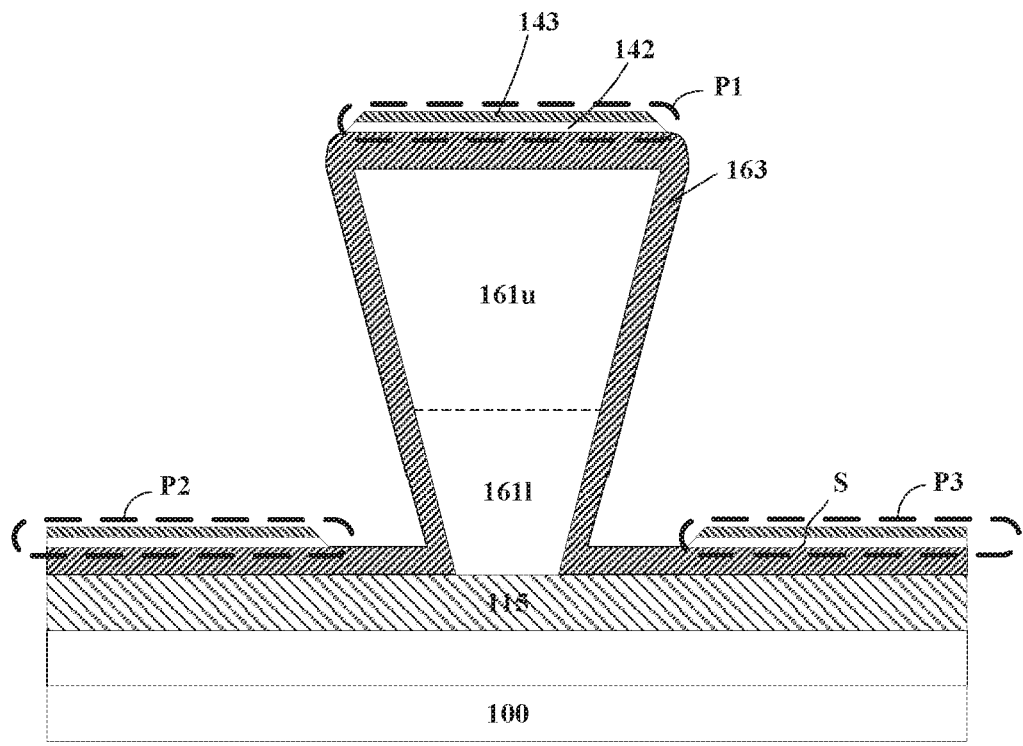
FIG. 5C is a schematic diagram illustrating the structure of an organic material layer and a cathode layer on a first barrier wall in some embodiments according to the present disclosure.

Referring to FIG. 1B, in some embodiments, a lateral side of the first lower portion is substantially co-planar with a lateral side of the first upper portion. FIG. 5A is a schematic diagram illustrating the structure of a first barrier wall in some embodiments according to the present disclosure. FIG. 5B is a schematic diagram illustrating the structure of a first barrier wall and an inorganic blocking layer in some embodiments according to the present disclosure. FIG. 5C is a schematic diagram illustrating the structure of an organic material layer and a cathode layer on a first barrier wall in some embodiments according to the present disclosure. The structures illustrated in FIGS. 5A to 5C are similar to those illustrated in FIGS. 3A to 3C, with the distinction that the lateral side of the first lower portion 161*l* is substantially co-planar with a lateral side of the first upper portion 161*u*. For example, as shown in FIG. 5A, the first lateral side LS1 of the first lower portion 161*l* and the first lateral side LS1' of the first upper portion 161*u* are substantially co-planar. In another example, the second lateral side LS2 of the first lower portion 161*l* and the second lateral side LS2' of the first upper portion 161*u* are substantially co-planar. As used herein, the term "substantially co-planar" refers to two or more surfaces on a structure sharing a same common plane or being offset no more than 100 nm (e.g., no more than 90 nm, no more than 80 nm, no more than 70 nm, no more than 60 nm, no more than 50 nm, no more than 40 nm, no more than 30 nm, no more than 20 nm, no more than 10 nm, no more than 5 nm, or no more than 1 nm) from sharing the same common plane. Optionally, the term "substantially co-planar" refers to two or more surfaces on a structure sharing a same common plane or being offset no more than 20 nm from sharing the same common plane.

Figure 6A:
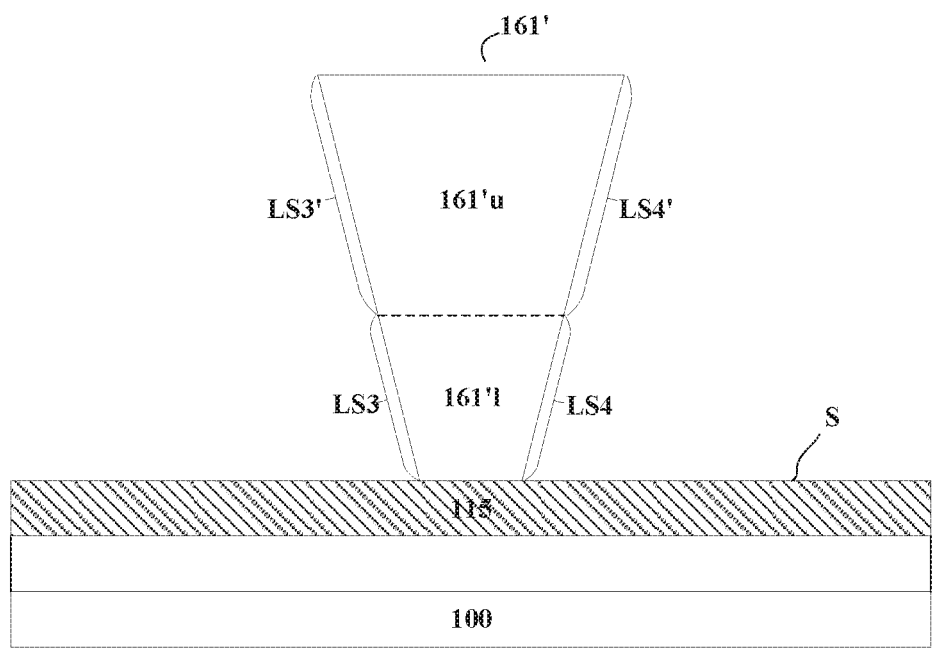
FIG. 6A is a schematic diagram illustrating the structure of a second barrier wall in some embodiments according to the present disclosure.
Figure 6B:
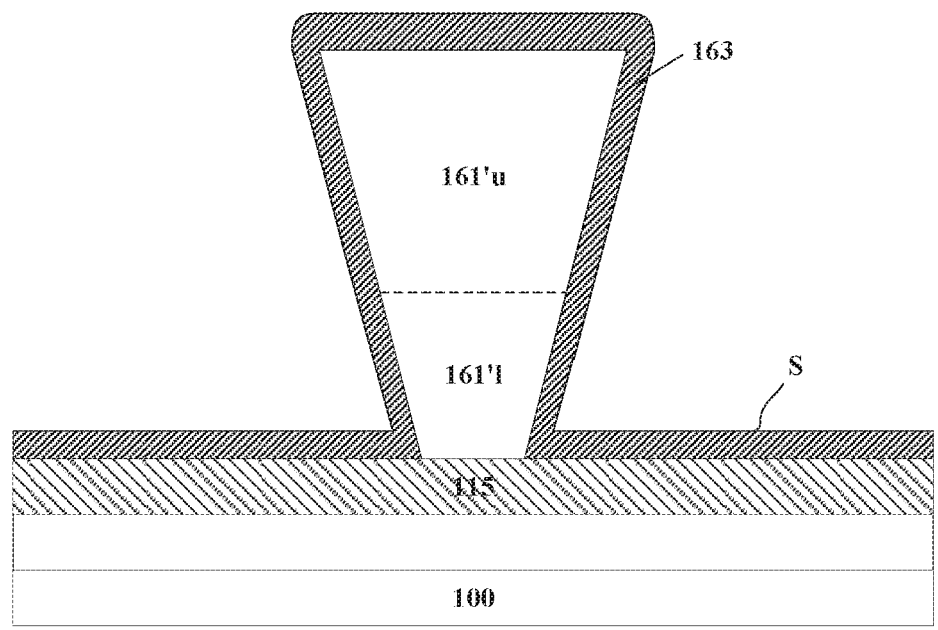
FIG. 6B is a schematic diagram illustrating the structure of a second barrier wall and an inorganic blocking layer in some embodiments according to the present disclosure.
Figure 6C:
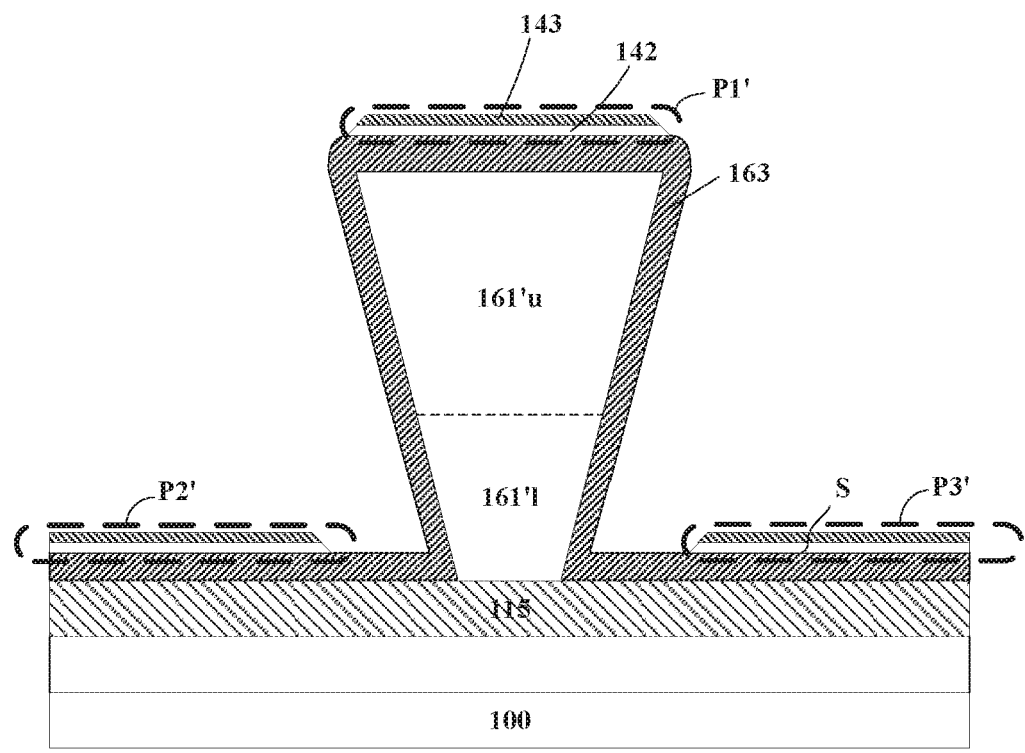
FIG. 6C is a schematic diagram illustrating the structure of an organic material layer and a cathode layer on a second barrier wall in some embodiments according to the present disclosure.

FIG. 6A is a schematic diagram illustrating the structure of a second barrier wall in some embodiments according to the present disclosure. FIG. 6B is a schematic diagram illustrating the structure of a second barrier wall and an inorganic blocking layer in some embodiments according to the present disclosure. FIG. 6C is a schematic diagram illustrating the structure of an organic material layer and a cathode layer on a second barrier wall in some embodiments according to the present disclosure. The structures illustrated in FIGS. 6A to 6C are similar to those illustrated in FIGS. 4A to 4C, with the distinction that the lateral side of the second lower portion 161'*l* is substantially co-planar with a lateral side of the second upper portion 161'*u*. For example, as shown in FIG. 6A, the third lateral side LS3 of the second lower portion 161'*l* and the third lateral side LS3' of the second upper portion 161'*u* are substantially co-planar. In another example, the fourth lateral side LS4 of the second lower portion 161'*l* and the fourth lateral side LS4' of the second upper portion 161'*u* are substantially co-planar.

Figure 7:
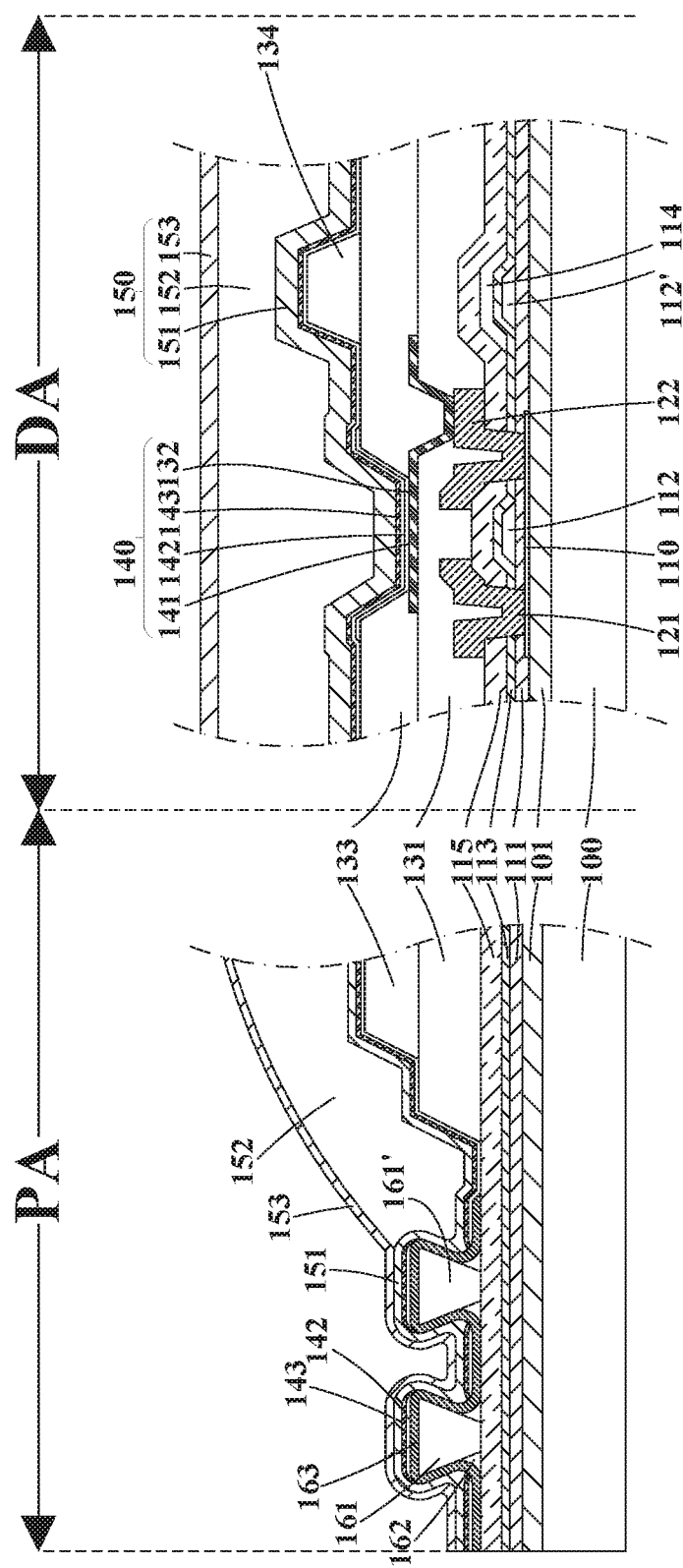
FIG. 7 is a cross-sectional view of a portion of a display substrate in some embodiments according to the present disclosure.

In some embodiments, the display substrate further includes a crack prevention layer in an angled space between a lateral side of the first barrier wall and a surface of the insulating layer. FIG. 7 is a cross-sectional view of a portion of a display substrate in some embodiments according to the present disclosure. Referring to FIG. 7, the display substrate in some embodiments has a display area DA and a peripheral area PA. In same embodiments, the display substrate includes a base substrate 100; a plurality of light emitting elements 140 on the base substrate 100 and in the display area DA; an encapsulating layer 150 on a side of the plurality of light emitting elements 140 distal to the base substrate 100 to encapsulate the plurality of light emitting elements 140; an insulating layer 115 on the base substrate 100; a first barrier wall 161 in the peripheral area PA and on a side of the insulating layer 115 away from the base substrate 100, the first barrier wall 161 forming a first enclosure substantially surrounding a first area; and a crack prevention layer 162 in an angled space between a lateral side of the first barrier wall 161 and a surface of the insulating layer 115.

Figure 8A:
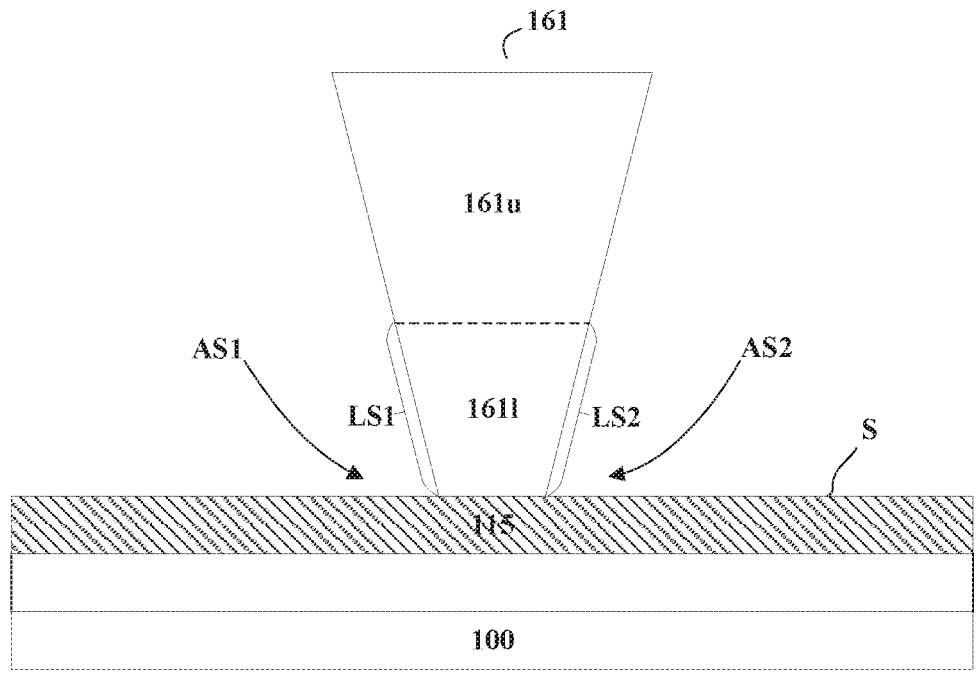
FIG. 8A is a schematic diagram illustrating the structure of a first barrier wall in some embodiments according to the present disclosure.
Figure 8B:
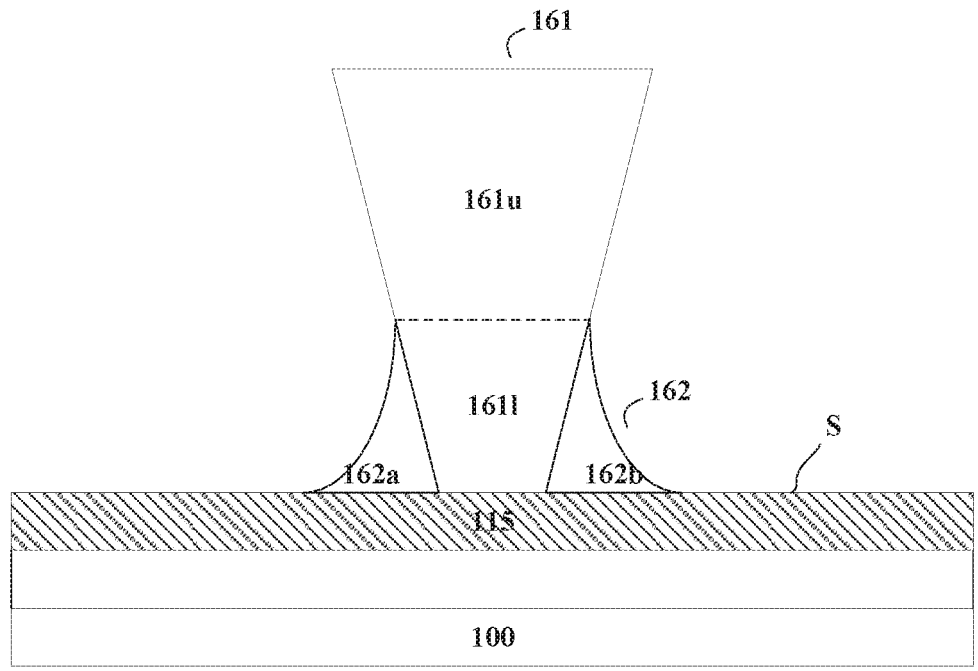
FIG. 8B is a schematic diagram illustrating the structure of a first barrier wall and a crack prevention layer in some embodiments according to the present disclosure.
Figure 8C:
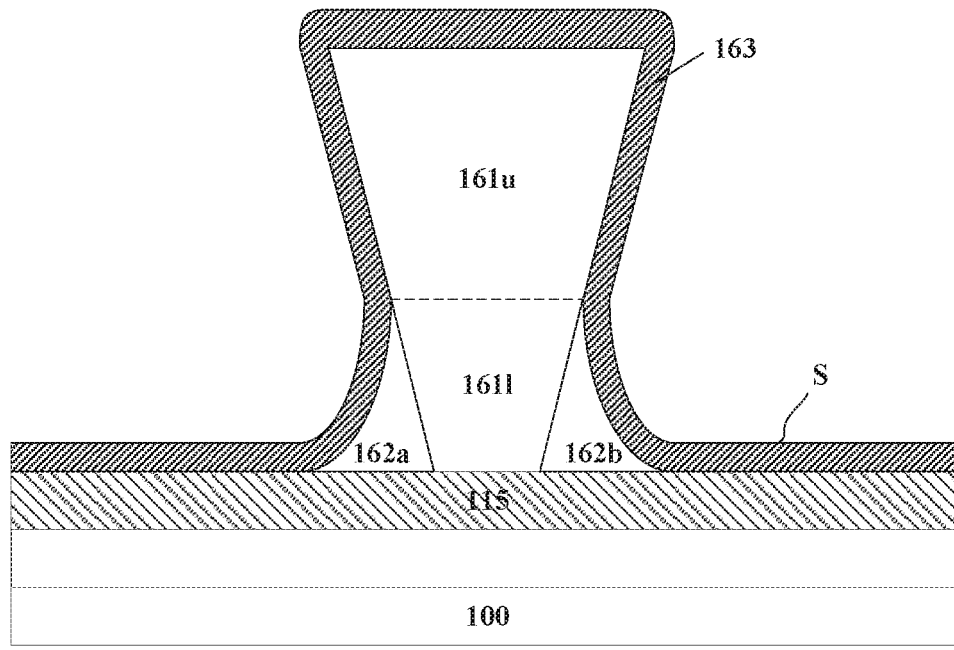
FIG. 8C is a schematic diagram illustrating the structure of a first barrier wall, a crack prevention layer, and an inorganic blocking layer in some embodiments according to the present disclosure.
Figure 8D:
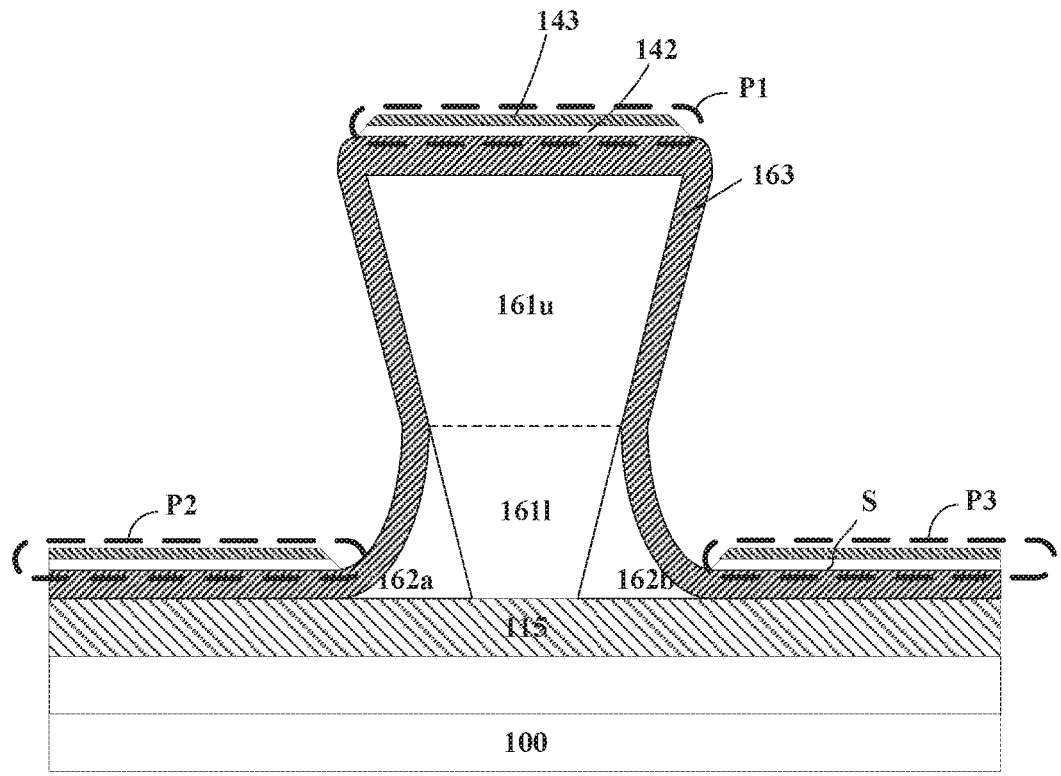
FIG. 8D is a schematic diagram illustrating the structure of an organic material layer and a cathode layer on a first barrier wall in some embodiments according to the present disclosure.

FIG. 8A is a schematic diagram illustrating the structure of a first barrier wall in some embodiments according to the present disclosure. FIG. 8B is a schematic diagram illustrating the structure of a first barrier wall and a crack prevention layer in some embodiments according to the present disclosure. FIG. 8C is a schematic diagram illustrating the structure of a first barrier wall, a crack prevention layer, and an inorganic blocking layer in some embodiments according to the present disclosure. FIG. 8D is a schematic diagram illustrating the structure of an organic material layer and a cathode layer on a first barrier wall in some embodiments according to the present disclosure. Referring to FIG. 8A, the first barrier wall 161 in some embodiments includes a first lower portion 161*l* in contact with the insulating layer 115 and a first upper portion 161*u* on a side of the first lower portion 161*l* away from the insulating layer 115. An orthographic projection of the first upper portion 161*u* on the base substrate 100 covers an orthographic projection of the first lower portion 161*l* on the base substrate 100. Optionally, a width of the first upper portion 161*u* along a direction from the first lateral side LS1 to the second lateral side LS2 is greater than a width of the first lower portion 161*l* along the direction from the first lateral side LS1 to the second lateral side LS2. Optionally, a minimum width of the first upper portion 161*u* along the direction from the first lateral side LS1 to the second lateral side LS2 is equal to or greater than a maximum width of the first lower portion 161*l* along the direction from the first lateral side LS1 to the second lateral side LS2. Optionally, a side (e.g., a top side) of the first upper portion 161*u* away from the base substrate 100 is wider than a side (e.g., a bottom side) of the first upper portion 161*u* closer to the base substrate 100. Optionally, a side (e.g., a top side) of the first lower portion 161*l* away from the base substrate 100 is wider than a side (e.g., a bottom side) of the first lower portion 161*l* closer to the base substrate 100. Optionally, a cross-section of the first barrier wall 161 along a plane perpendicular to the insulating layer 115 along the direction from the first lateral side LS1 to the second lateral side LS2 has a substantially inverted trapezoidal shape. Optionally, a cross-section of the first upper portion 161*u* along a plane perpendicular to the insulating layer 115 along the direction from the first lateral side LS1 to the second lateral side LS2 has a substantially inverted trapezoidal shape. Optionally, a cross-section of the first lower portion 161*l* along a plane perpendicular to the insulating layer 115 along the direction from the first lateral side LS1 to the second lateral side LS2 has a substantially inverted trapezoidal shape.

In some embodiments, a first lateral side LS1 of the first lower portion 161*l* forms a first angled space AS1 with a surface S of the insulating layer 115; and a second lateral side LS2 of the first lower portion 161*l* forms a second angled space AS2 with the surface S of the insulating layer 115. Referring to FIG. 8A and FIG. 8B, in some embodiments, the crack prevention layer 162 includes a first crack prevention sub-layer 162*a* in the first angled space AS1 and a second crack prevention sub-layer 162*b* in the second angled space AS2. The first crack prevention sub-layer 162*a* covers the first lateral side LS1 of the first lower portion 161*l*; and the second crack prevention sub-layer 162*b* covers the second lateral side LS2 of the first lower portion 161*l*. As shown in FIG. 8B, the first lower portion 161*l*, the first crack prevention sub-layer 162*a*, and the second crack prevention sub-layer 162*b* together forms a structure having a side away from the base substrate narrower than a side closer to the base substrate (e.g., a quasi-trapezoidal shape). Optionally, a height of the first crack prevention sub-layer 162*a* relative to the surface S of the insulating layer 115 is no more than half of a height of the first barrier wall 161 relative to the surface S of the insulating layer 115; and a height of the second crack prevention sub-layer 162*b* relative to the surface S of the insulating layer 115 is no more than half of a height of the first barrier wall 161 relative to the surface S of the insulating layer 115. Optionally, the first crack prevention sub-layer 162*a* has a lateral side having a concave surface. Optionally, the second crack prevention sub-layer 162b has a lateral side having a concave surface. Optionally, the structure formed by first barrier wall 161, the first crack prevention sub-layer 162a, and the second crack prevention sub-layer 162b forms a combined wall having two concave wall sides.

Optionally, the first crack prevention sub-layer 162a forms an enclosure substantially surrounding an area smaller than the first area substantially surrounded by the first barrier wall 161. Optionally, the second crack prevention sub-layer 162h forms an enclosure substantially surrounding an area greater than the first area substantially surrounded by the first barrier wall 161. Optionally, the enclosure formed by the second crack prevention sub-layer 162b encloses the first enclosure formed by the first barrier wall 161, and the first enclosure encloses the enclosure formed by the first crack prevention sub-layer 162a. Optionally, the crack prevention layer 162 and the first barrier wall 161 are made using different materials.

Referring to FIG. 7 and FIG. 8C, the display substrate in some embodiments further includes an inorganic blocking layer 163 covering the first barrier wall 161 and the crack prevention layer 162. Optionally, the inorganic blocking layer 163 is limited in the peripheral area PA. Optionally, the inorganic blocking layer 163 is in direct contact with both the first barrier wall 161 and the crack prevention layer 162. Optionally, the inorganic blocking layer 163 further extends into regions outside the first barrier wall 161 and the crack prevention layer 162, and is in direct contact with the insulating layer 115.

Specifically, referring to FIGS. 8A to 8C, the inorganic blocking layer 163 covers and optionally is in direct contact with a top surface (e.g., a surface away from the base substrate 100) of the first upper portion 161u. The inorganic blocking layer 163 further covers and optionally is in direct contact with lateral sides of the first upper portion 161u. The inorganic blocking layer 163 further covers and optionally is in direct contact with the lateral side of the first crack prevention sub-layer 162a, and covers and optionally is in direct contact with the lateral side of the second crack prevention sub-layer 162b.

By having the crack prevention layer 162 (including the first crack prevention sub-layer 162a and the second crack prevention sub-layer 162b), the angled space between the lateral side of the first barrier wall 161 and a surface of the insulating layer 115 can be at least partially filled. The crack prevention layer 162 further stabilizes the first barrier wall 161 on the insulating layer 115. By at least partially eliminating the dead space between the lateral side of the first barrier wall 161 and a surface of the insulating layer 115, subsequent inorganic blocking layer 163 can be formed in this region without cracks, thereby completely encapsulating the display area. For example, in some embodiments, the inorganic blocking layer 163 completely covers, without cracks, lateral sides of a structure formed by the first barrier wall 161 and the crack prevention layer 162 together.

Referring to FIG. 7 and FIG. 8D, in some embodiments, the display substrate further includes one or a combination of an organic material layer 142 (e.g., an organic light emitting layer) and a cathode layer 143 on a side of the inorganic blocking layer 163 away from the base substrate 100, isolated into discontinued portions by lateral sides of the first barrier wall 161. For example. FIG. 8D shows a first portion P1, a second portion P2, and a third portion P3 that are isolated into discontinued portions by lateral sides of the first barrier wall 161. The first portion P1 is on a side of the first barrier wall 161 away from the base substrate 100, an orthographic projection of the first portion P1 on the base substrate 100 at least partially overlaps with an orthographic projection of the first barrier wall 161 on the base substrate 100. The second portion P2 and the third portion P3 are on a side of the inorganic blocking layer 163 away from the base substrate 100, orthographic projections of the second portion P2 and the third portion P3 on the base substrate 100 are substantially non-overlapping (e.g., completely non-overlapping) with the orthographic projection of the first barrier wall 161 on the base substrate 100.

In one example, the at least one inorganic sub-layer of the encapsulating layer 150 (e.g., one or both of the first inorganic encapsulating sub-layer 151 and the second inorganic encapsulating sub-layer 153) completely covers, without cracks, a portion of the inorganic blocking layer 163 covering the lateral sides of the structure formed by the first barrier wall and the crack prevention layer together. By having the crack prevention layer 162 (including the first crack prevention sub-layer 162a and the second crack prevention sub-layer 162b), the angled space between the lateral side of the first barrier wall 161 and a surface of the insulating layer 115 can be at least partially filled. The crack prevention layer 162 further stabilizes the first barrier wall 161 on the insulating layer 115. By at least partially eliminating the dead space between the lateral side of the first barrier wall 161 and a surface of the insulating layer 115, subsequent inorganic sub-layer of the encapsulating layer 150 can be formed in this region without cracks, thereby completely encapsulating the display area. For example, in some embodiments, the at least one inorganic sub-layer of the encapsulating layer 150 completely covers, without cracks, lateral sides of a structure formed by the first barrier wall 161 and the crack prevention layer 162 together.

Figure 9A:
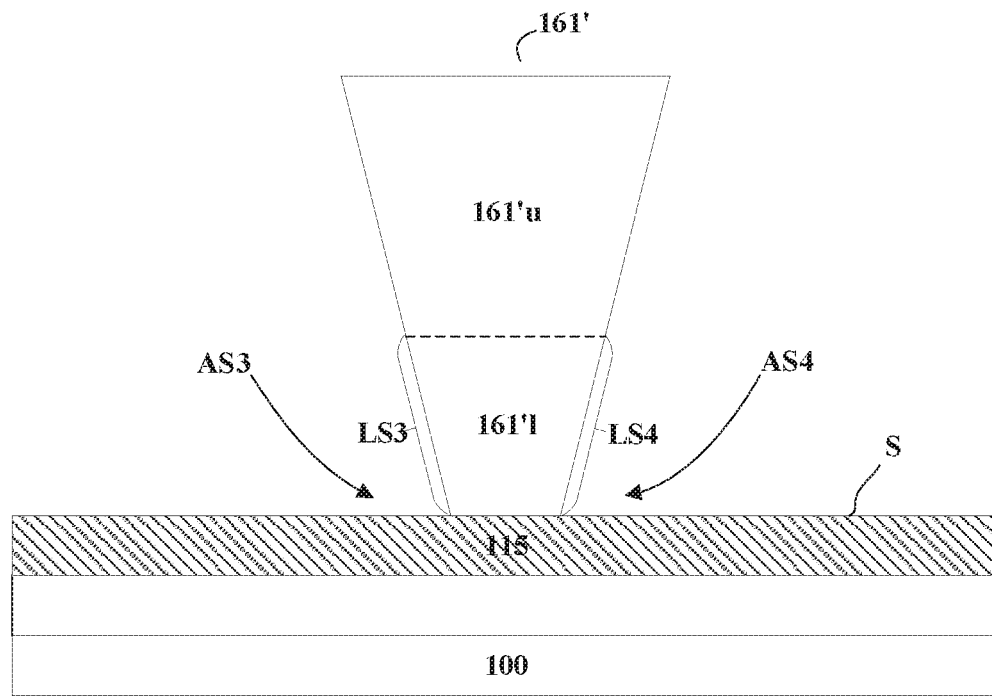
FIG. 9A is a schematic diagram illustrating the structure of a second barrier wall in some embodiments according to the present disclosure.
Figure 9B:
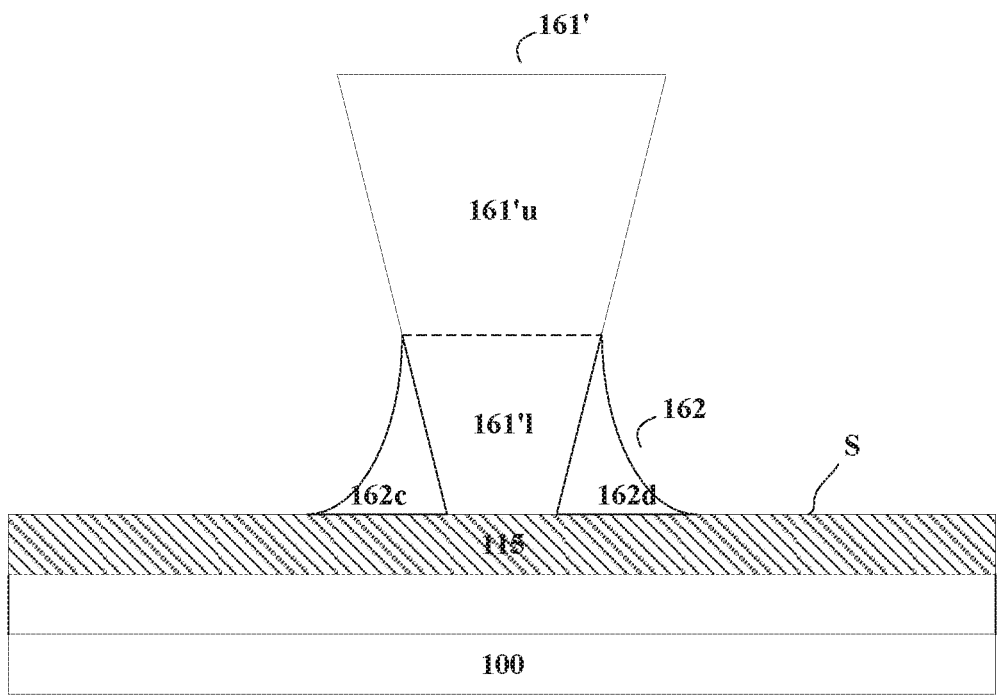
FIG. 9B is a schematic diagram illustrating the structure of a second barrier wall and a crack prevention layer in some embodiments according to the present disclosure.
Figure 9C:
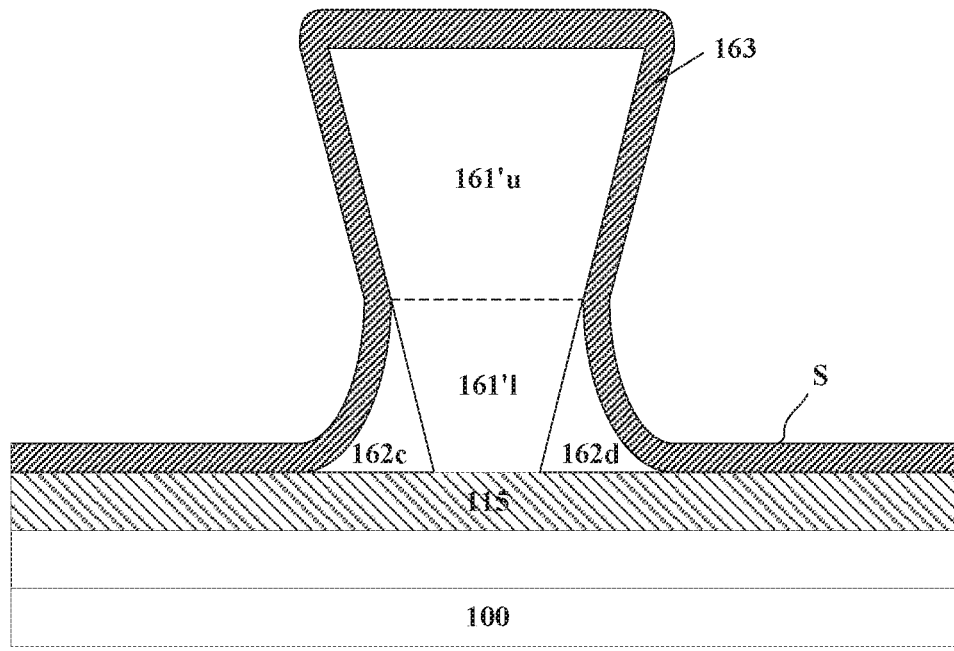
FIG. 9C is a schematic diagram illustrating the structure of a second barrier wall, a crack prevention layer, and an inorganic blocking layer in some embodiments according to the present disclosure.
Figure 9D:
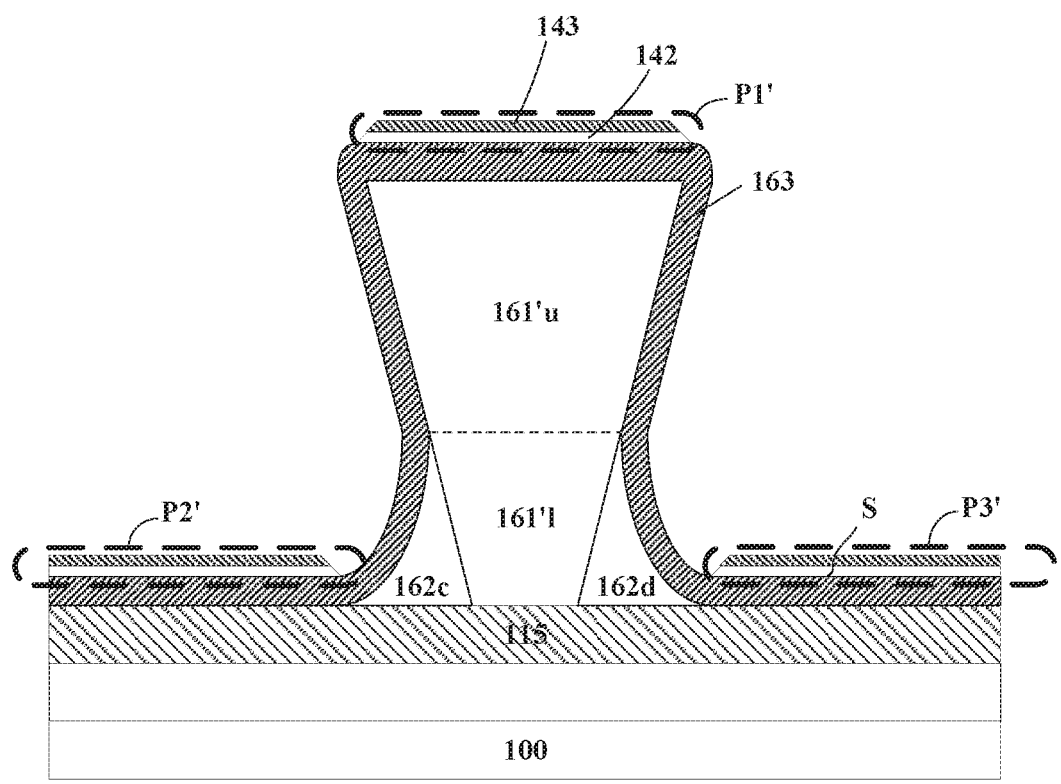
FIG. 9D is a schematic diagram illustrating the structure of an organic material layer and a cathode layer on a second barrier wall in some embodiments according to the present disclosure.

FIG. 9A is a schematic diagram illustrating the structure of a second barrier wall in some embodiments according to the present disclosure. FIG. 9B is a schematic diagram illustrating the structure of a second barrier wall and a crack prevention layer in some embodiments according to the present disclosure. FIG. 9C is a schematic diagram illustrating the structure of a second barrier wall, a crack prevention layer, and an inorganic blocking layer in some embodiments according to the present disclosure. FIG. 9D is a schematic diagram illustrating the structure of an organic material layer and a cathode layer on a second barrier wall in some embodiments according to the present disclosure. Referring to FIGS. 7, 9B to 9D, the crack prevention layer 162 is in an angled space between a lateral side of the second barrier wall 161' and a surface S of the insulating layer 115. In some embodiments, the second barrier wall 161' includes a second lower portion 161'l in contact with the insulating layer 115 and a second upper portion 161'u on a side of the second lower portion 161'l away from the insulating layer 115. Optionally, an orthographic projection of the second upper portion 161'u on the base substrate 100 covers an orthographic projection of the second lower portion 161'l on the base substrate 100. Optionally, a third lateral side LS3 of the second lower portion 161'l forms a third angled space AS3 with a surface S of the insulating layer 115, and a fourth lateral side LS4 of the second lower portion 161'l forms a fourth angled space AS4 with the surface S of the insulating layer 115. Optionally, the crack prevention layer 162 includes a third crack prevention sub-layer 162c in the third angled space AS3 and a fourth crack prevention sub-layer 162d in the fourth angled space AS4. Optionally, the third crack prevention sub-layer 162c covers the third lateral side LS3 of the second lower portion 161'l; and the fourth crack prevention sub-layer 162d covers the fourth lateral side LS4 of the second lower portion 161'l.

In some embodiments, a side of the second upper portion 161'u away from the base substrate 100 is wider than a side of the second upper portion 161'u closer to the base substrate 100; and a side of the second lower portion 161'l away from the base substrate 100 is wider than a side of the second lower portion 161'l closer to the base substrate 100. Optionally, a cross-section of the second barrier wall 161' along a plane perpendicular to the insulating layer 115 along a direction from the third lateral side LS3 to the fourth lateral side LS4 has a substantially inverted trapezoidal shape. Optionally, the second lower portion 161'l, the third crack prevention sub-layer 162c, and the fourth crack prevention sub-layer 162d together forms a structure having a side away from the base substrate 100 narrower than a side closer to the base substrate 100. Optionally, a height of the third crack prevention sub-layer 162c relative to the surface S of the insulating layer 115 is no more than half of a height of the second barrier wall 161' relative to the surface S of the insulating layer 115; and a height of the fourth crack prevention sub-layer 162d relative to the surface S of the insulating layer 115 is no more than half of a height of the second barrier wall 161' relative to the surface S of the insulating layer 115. Optionally, the first barrier wall 161 and the second barrier wall 161' include a negative photoresist material; and the crack prevention layer 162 includes a positive photoresist material. Optionally, the structure formed by second barrier wall 161', the third crack prevention sub-layer 162c, and the fourth crack prevention sub-layer 162d forms a combined wall having two concave wall sides.

In some embodiments, the inorganic blocking layer 163 substantially covers the first barrier wall 161, the crack prevention layer 162, the second barrier wall 161', and any region between the first barrier wall 161 and the second barrier wall 161'. The inorganic blocking layer 163 is limited in the peripheral area PA. Optionally, the inorganic blocking layer 163 is in direct contact with the first barrier wall 161, the crack prevention layer 162, the second barrier wall 161', and the insulating layer 115. Optionally, the inorganic blocking layer 163 completely covers, without cracks, lateral sides of a structure formed by the second barrier wall 161', the third crack prevention sub-layer 162c, and the fourth crack prevention sub-layer 162d together.

In some embodiments, one or a combination of the organic material layer 142 and the cathode layer 143 are on a side of the inorganic blocking layer 163 away from the base substrate 100, isolated into discontinued portions by lateral sides of the second barrier wall 161'. For example, FIG. 9D shows a fourth portion P1', a fifth portion P2', and a sixth portion P3' that are isolated into discontinued portions by lateral sides of the second barrier wall 161'. The fourth portion P1' is on a side of the second barrier wall 161' away from the base substrate 100, an orthographic projection of the fourth portion P1' on the base substrate 100 at least partially overlaps with an orthographic projection of the second barrier wall 161' on the base substrate 100. The fifth portion P2' and the sixth portion P3' are on a side of the inorganic blocking layer 163 away from the base substrate 100, orthographic projections of the fifth portion P2' and the sixth portion P3' on the base substrate 100 are substantially non-overlapping (e.g., completely non-overlapping) with the orthographic projection of the second barrier wall 161' on the base substrate 100.

In some embodiments, at least one inorganic sub-layer of the encapsulating layer 150 (e.g., one or both of the first inorganic encapsulating sub-layer 151 and the second inorganic encapsulating sub-layer 153) is on a side of the inorganic blocking layer 163 away from the base substrate 100. Optionally, the at least one inorganic sub-layer of the encapsulating layer 150 is on a side of the second barrier wall 161' away from the base substrate 100. Optionally, the at least one inorganic sub-layer of the encapsulating layer 150 (e.g., one or both of the first inorganic encapsulating sub-layer 151 and the second inorganic encapsulating sub-layer 153) completely covers, without cracks, a portion of the inorganic blocking layer 163 covering the lateral sides of the structure formed by the second barrier wall 161', the third crack prevention sub-layer 162c, and the fourth crack prevention sub-layer 162d together. By having the crack prevention layer 162 (including the third crack prevention sub-layer 162c and the fourth crack prevention sub-layer 162d), the angled space between the lateral side of the second barrier wall 161' and a surface of the insulating layer 115 can be at least partially filled. The crack prevention layer 162 further stabilizes the second barrier wall 161' on the insulating layer 115. By at least partially eliminating the dead space between the lateral side of the second barrier wall 161' and a surface of the insulating layer 115, subsequent inorganic sub-layer of the encapsulating layer 150 can be formed in this region without cracks, thereby completely encapsulating the display area. For example, in some embodiments, the at least one inorganic sub-layer of the encapsulating layer 150 completely covers, without cracks, lateral sides of a structure formed by the second barrier wall 161', the third crack prevention sub-layer 162c, and the fourth crack prevention sub-layer 162d together.

Various appropriate materials and various appropriate fabricating methods may be used to make the crack prevention layer 162. For example, an insulating material may be deposited by a plasma-enhanced chemical vapor deposition (PECVD) process or a sputtering process, e.g., a magnetron sputtering process. The deposited insulating material layer is then patterned, e.g., by a lithographic process. Optionally, the crack prevention layer 162 is made of a positive photoresist material. The crack prevention layer 162 may be formed by forming a positive photoresist material layer on a side of the first barrier wall away from the base substrate; and patterning the positive photoresist material layer to form the crack prevention layer. The positive photoresist material layer is formed to be filled in the angled space. Due to the undercut profile of the first barrier wall 161, the positive photoresist material filled in the angled space is not exposed or insufficiently exposed. During development of the positive photoresist material layer, the positive photoresist material in the angled space remains, whereas the positive photoresist material layer is removed during the patterning the positive photoresist material layer, except for a portion in the angled space between the lateral side of the first barrier wall 161 and the surface S of the insulating layer 115, thereby forming the crack prevention layer 162.

Optionally, the crack prevention layer 162 and the planarization layer 131 are formed in a same patterning process using a same mask plate, the crack prevention layer 162 and the planarization layer 131 are formed in a same layer and using a same insulating material. As used herein, the term "same layer" refers to the relationship between the layers simultaneously formed in the same step. In one example, the crack prevention layer 162 and the planarization layer 131 are in a same layer when they are formed as a result of one or more steps of a same patterning process performed in a same layer of material. In another example, the crack prevention layer 162 and the planarization layer 131 can be formed in a same layer by simultaneously performing the step of forming the crack prevention layer 162 and the step of forming the planarization layer 131. The term "same layer" does not always mean that the thickness of the layer or the height of the layer in a cross-sectional view is the same.

Optionally, the crack prevention layer 62 and the pixel definition layer 133 are formed in a same patterning process using a same mask plate, the crack prevention layer 162 and the pixel definition layer 133 are formed in a same layer and using a same insulating material.

Optionally, the crack prevention layer 162 and the spacer 134 are formed in a same patterning process using a same mask plate, the crack prevention layer 162 and the spacer 134 are formed in a same layer and using a same insulating material.

In another aspect, the present disclosure provides a method of fabricating a display substrate having a display area and a peripheral area. In some embodiments, the method includes forming a plurality of light emitting elements on a base substrate and in the display area; forming an encapsulating layer on a side of the plurality of light emitting elements distal to the base substrate to encapsulate the plurality of light emitting elements; forming an insulating layer, wherein the insulating layer is formed between the encapsulating layer and the base substrate; and forming a first barrier wall in the peripheral area and on a side of the insulating layer away from the base substrate, the first barrier wall forming a first enclosure substantially surrounding a first area. Optionally, the first barrier wall is formed to include a first lower portion in contact with the insulating layer and a first upper portion on a side of the first lower portion away from the insulating layer. Optionally, an orthographic projection of the first upper portion on the base substrate covers an orthographic projection of the first lower portion on the base substrate. Optionally, the first barrier wall is formed so that a side of the first barrier wall away from the base substrate is wider than a side of the first barrier wall closer to the base substrate, along a width direction of the first barrier wall from the peripheral area to the display area.

In some embodiments, the step of forming the first barrier wall includes forming a negative photoresist material layer in the peripheral area and on a side of the insulating layer away from the base substrate; exposing the negative photoresist material layer using a mask plate having a light transmissive region corresponding to the first barrier wall to generate an exposed negative photoresist material layer; and developing the exposed negative photoresist material layer to form the first barrier wall. Optionally, the first barrier wall is formed to have an undercut profile.

In some embodiments, a lateral side of the first lower portion is substantially co-planar with a lateral side of the first upper portion.

In some embodiments, the step of forming the first barrier wall includes forming an image reversal photoresist material layer in the peripheral area and on a side of the insulating layer away from the base substrate; exposing the image reversal photoresist material layer using a mask plate having a light transmissive region corresponding to the first barrier wall to generate a first exposed photoresist material layer; reversal baking the first exposed photoresist material layer to generate a reversed photoresist material layer; exposing the reversed photoresist material layer to generate a second exposed photoresist material layer; and developing the second exposed photoresist material layer to form the first barrier wall. Optionally, the first barrier wall is formed to have an undercut profile.

In some embodiments, a lateral side of the first lower portion is substantially co-planar with a lateral side of the first upper portion.

In some embodiments, the step of forming the first barrier wall includes forming a first material layer in the peripheral area and on a side of the insulating layer away from the base substrate; forming a second material layer in the peripheral area and on a side of the first material layer away from the base substrate; and patterning the first material layer and the second material layer to form the first barrier wall.

In some embodiments, the first material layer is a first positive photoresist material layer and the second material layer is a second positive photoresist material layer. Optionally, the first positive photoresist material layer is more sensitive to exposure as compared to the second positive photoresist material layer. Optionally, the step of forming the first barrier wall includes forming the first positive photoresist material layer in the peripheral area and on a side of the insulating layer away from the base substrate; forming the second positive photoresist material layer in the peripheral area and on a side of the first positive photoresist material layer away from the base substrate; exposing the first positive photoresist material layer and the second positive photoresist material layer simultaneously using a mask plate having a light blocking region corresponding to the first barrier wall to generate an exposed first positive photoresist material layer and an exposed second positive photoresist material layer; and developing the exposed first positive photoresist material layer and the exposed second positive photoresist material layer to form the first barrier wall. Optionally, the first lower portion is generated by developing the exposed first positive photoresist material layer. Optionally, the first upper portion is generated by developing the exposed second positive photoresist material layer. Optionally, a lateral side of the first lower portion is non-coplanar with a lateral side of the first upper portion.

In some embodiments, the first material layer is a positive photoresist material layer and the second material layer is a negative photoresist material layer. Optionally, the step of forming the first barrier wall includes forming the positive photoresist material layer in the peripheral area and on a side of the insulating layer away from the base substrate; forming the negative photoresist material layer in the peripheral area and on a side of the positive photoresist material layer away from the base substrate; exposing the negative photoresist material layer using a first mask plate having a light transmissive region corresponding to the first barrier wall to generate an exposed negative photoresist material layer; developing the exposed negative photoresist material layer to generate the first upper portion; exposing the positive photoresist material layer using a second mask plate having a light blocking region corresponding to the first barrier wall to generate an exposed positive photoresist material layer; and developing the exposed positive photoresist material layer to generate the first lower portion. Optionally, a lateral side of the first lower portion is non-coplanar with a lateral side of the first upper portion.

In some embodiments, the first material layer is a first negative photoresist material layer and the second material layer is a second negative photoresist material layer. Optionally, the second negative photoresist material layer is more sensitive to exposure as compared to the first negative photoresist material layer. Optionally, the step of forming the first barrier wall includes forming the first negative photoresist material layer in the peripheral area and on a side of the insulating layer away from the base substrate; forming the second negative photoresist material layer in the peripheral area and on a side of the first negative photoresist material layer away from the base substrate; exposing the first negative photoresist material layer and the second negative photoresist material layer simultaneously using a mask plate having a light transmissive region corresponding to the first barrier wall to generate an exposed first negative photoresist material layer and an exposed second negative photoresist material layer; and developing the exposed first negative photoresist material layer and the exposed second negative photoresist material layer to form the first barrier wall. Optionally, the first lower portion is generated by developing the exposed first negative photoresist material layer. Optionally, the first upper portion is generated by developing the exposed second negative photoresist material layer. Optionally, a lateral side of the first lower portion is non-coplanar with a lateral side of the first upper portion.

In some embodiments, the first material layer is a metallic material layer and the second material layer is a photoresist material layer. Optionally, the step of forming the first barrier wall includes forming the metallic material layer in the peripheral area and on a side of the insulating layer away from the base substrate; forming the photoresist material layer in the peripheral area and on a side of the metallic material layer away from the base substrate; exposing the photoresist material layer to generate an exposed photoresist material layer; developing the exposed photoresist material layer to form the first upper portion; and etching the metallic material layer to form the first lower portion.

In some embodiments, the first lower portion has a first side in contact with the insulating layer and a second side opposite to the first side, the first side and the second side being connected by the lateral side of the first lower portion; the first upper portion has a third side in contact with the first lower portion and a fourth side opposite to the third side, the third side and the fourth side being connected by the lateral side of the first upper portion; and the third side is wider than the first side and the second side along the width direction of the first barrier wall.

In some embodiments, the method further includes forming a second barrier wall in the peripheral area and on a side of the insulating layer away from the base substrate, the second barrier wall forming a second enclosure substantially surrounding a second area.

In some embodiments, the method further includes punching an aperture through the display substrate to form a window region. Optionally, the window region is substantially surrounded by the first enclosure.

Figure 10A:
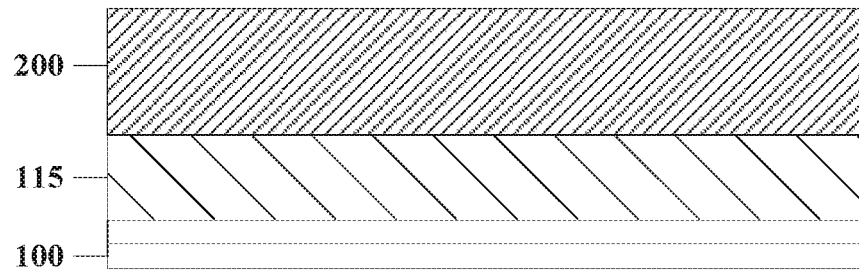
FIGS. 10A to 10C illustrates a method of fabricating a display substrate in some embodiments according to the present disclosure.
Figure 10B:
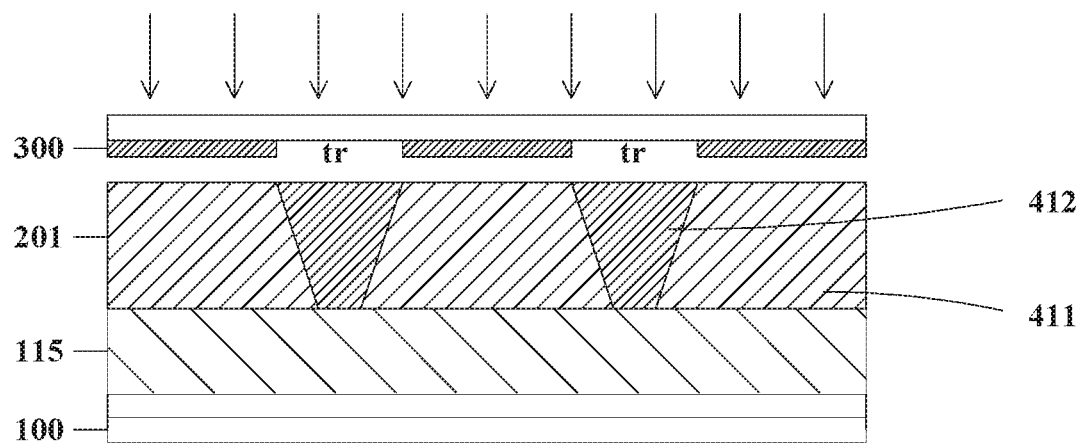
Figure 10C:
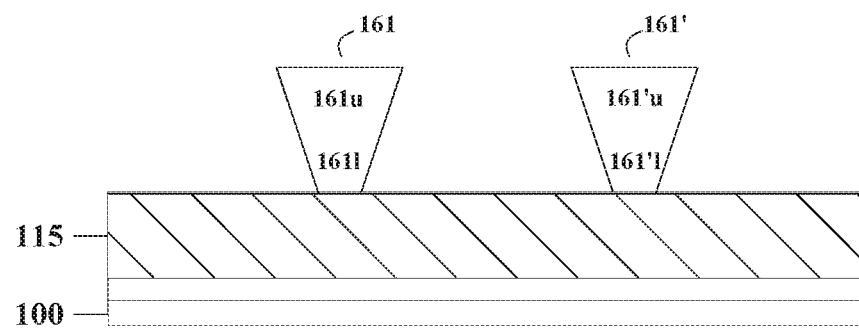

FIGS. 10A to 10C illustrates a method of fabricating a display substrate in some embodiments according to the present disclosure. Referring to FIG. 10A, a negative photoresist material layer 200 is formed in the peripheral area and on a side of the insulating layer 115 away from the base substrate 100. Referring to FIG. 10B, a mask plate 300 having a light transmissive region tr corresponding to the first barrier wall and the second barrier wall is placed on top of the negative photoresist material layer 200. The negative photoresist material layer 200 is exposed (e.g., using UV light) using the mask plate 300 having a light transmissive region tr corresponding to the first barrier wall and the second barrier, to generate an exposed negative photoresist material layer 201 having an exposed region 412 corresponding to the first barrier wall and the second barrier wall, and an unexposed region 411 outside the exposed region 412. Referring to FIG. 10B and FIG. 10C, the exposed negative photoresist material layer 201 is developed to form the first barrier wall 161 and the second barrier wall 161'. The first barrier wall 161 and the second barrier wall 161' are formed to have an undercut profile.

Figure 11A:
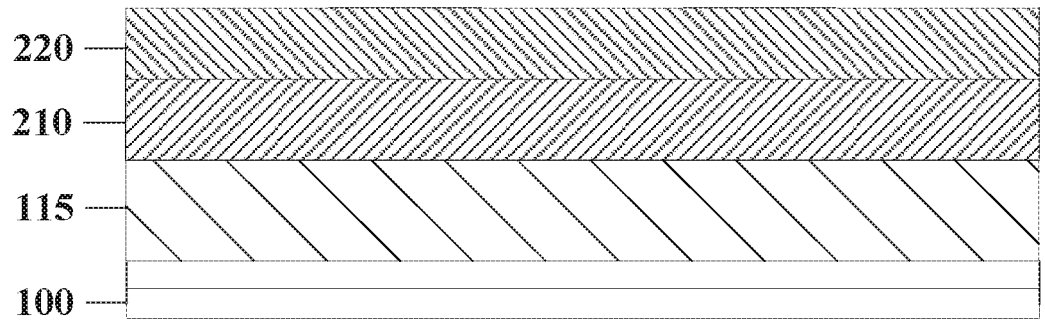
FIGS. 11A to 11C illustrates a method of fabricating a display substrate in some embodiments according to the present disclosure.
Figure 11B:
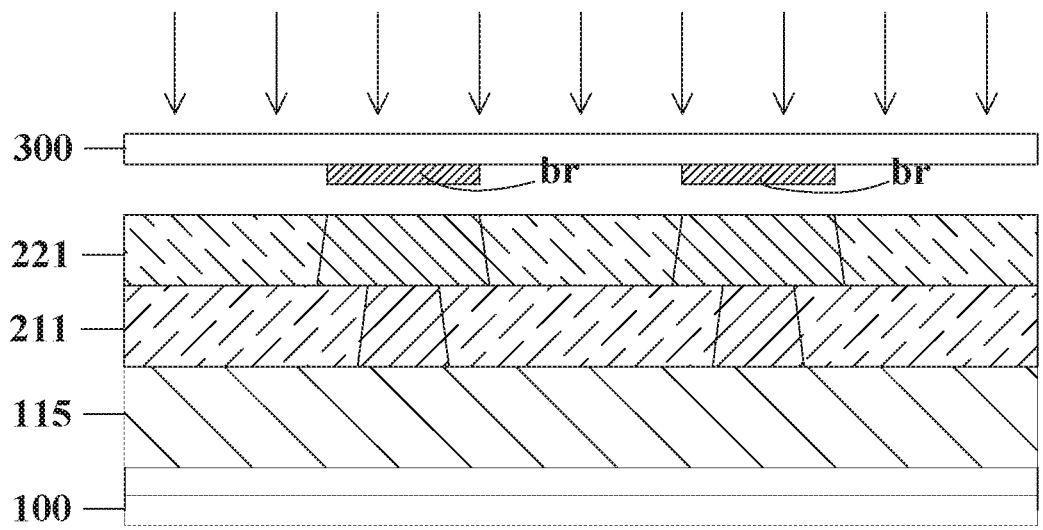
Figure 11C:
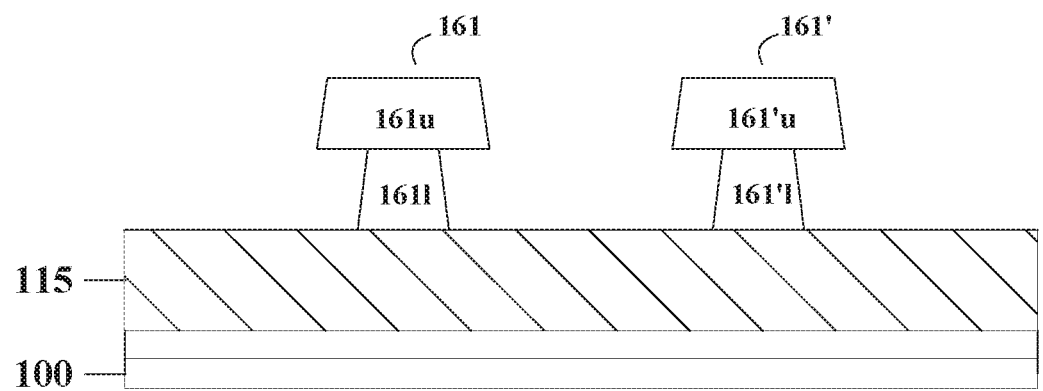

FIGS. 11A to 11C illustrates a method of fabricating a display substrate in some embodiments according to the present disclosure. Referring to FIG. 11A, a first positive photoresist material layer 210 is formed in the peripheral area and on a side of the insulating layer 115 away from the base substrate 100, a second positive photoresist material layer 220 is formed in the peripheral area and on a side of the first positive photoresist material layer 210 away from the base substrate 100. The first positive photoresist material layer 210 is more sensitive to exposure as compared to the second positive photoresist material layer 220. For example, the first positive photoresist material layer 210 has a higher content of photo acid generators as compared to the second positive photoresist material layer 220. A larger exposed area results in the first positive photoresist material layer 210 as compared to the second positive photoresist material layer 220. Referring to FIG. 11A and FIG. 11B, a mask plate 300 having a light blocking region br corresponding to the first barrier wall and the second barrier wall is placed on top of the first positive photoresist material layer 210 and the second positive photoresist material layer 220. The first positive photoresist material layer 210 and the second positive photoresist material layer 220 are exposed simultaneously (e.g., using UV light) using the mask plate 300 having a light blocking region br corresponding to the first barrier wall and the second barrier wall, to generate an exposed first positive photoresist material layer 211 and an exposed second positive photoresist material layer 221. Referring to FIG. 11C, the exposed first positive photoresist material layer 211 and the exposed second positive photoresist material layer 221 are developed to form the first barrier wall 161 and the second barrier wall 161'. Referring to FIG. 11C, FIGS. 3A to 3C, and FIGS. 4A to 4C, the first lower portion 161*l* and the second lower portion 161'*l* are generated by developing the exposed first positive photoresist material layer 211, the first upper portion 161*u* and the second upper portion 161'*u* are generated by developing the exposed second positive photoresist material layer 221. Optionally, a lateral side of the first lower portion 161*l* is non-coplanar with a lateral side of the first upper portion 161*u*, and a lateral side of the second lower portion 161'*l* is non-coplanar with a lateral side of the second upper portion 161'*u*.

Figure 12A:
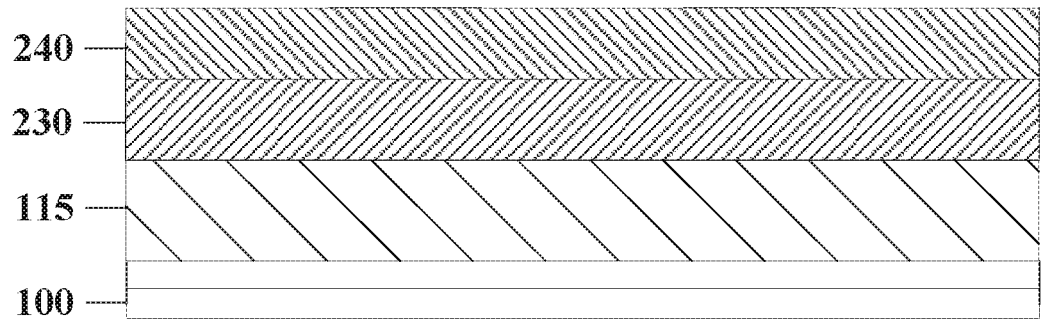
FIGS. 12A to 12C illustrates a method of fabricating a display substrate in some embodiments according to the present disclosure.
Figure 12B:
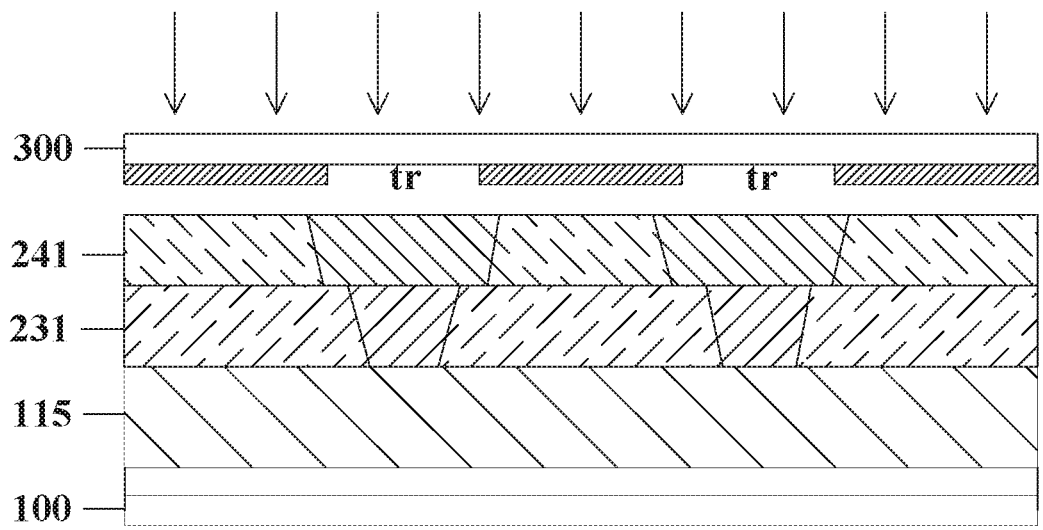
Figure 12C:
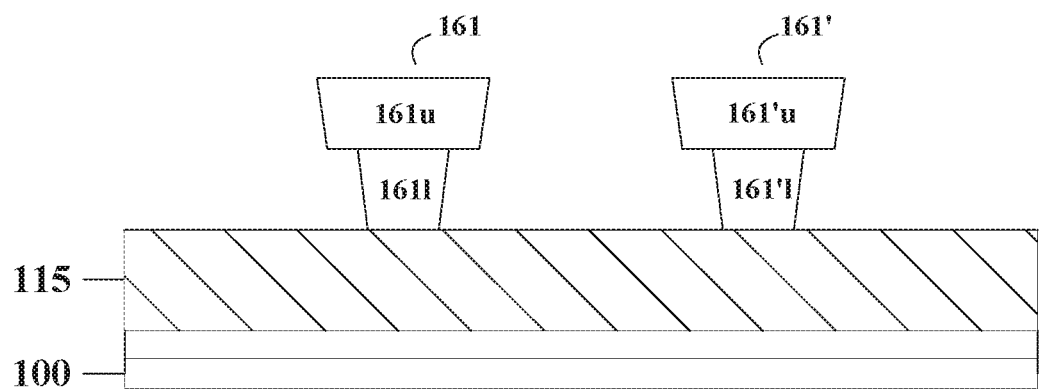

FIGS. 12A to 12C illustrates a method of fabricating a display substrate in some embodiments according to the present disclosure. Referring to FIG. 12A, a first negative photoresist material layer 230 is formed in the peripheral area and on a side of the insulating layer 115 away from the base substrate 100, a second negative photoresist material layer 240 is formed in the peripheral area and on a side of the first negative photoresist material layer 230 away from the base substrate 100. The second negative photoresist material layer 240 is more sensitive to exposure as compared to the first negative photoresist material layer 230. For example, a larger exposed area results in the second negative photoresist material layer 240 as compared to the first negative photoresist material layer 230. Referring to FIG. 12A and FIG. 12B, a mask plate 300 having a light transmissive region tr corresponding to the first barrier wall and the second barrier wall is placed on top of the first negative photoresist material layer 230 and the second negative photoresist material layer 240. The first negative photoresist material layer 230 and the second negative photoresist material layer 240 are exposed simultaneously (e.g., using UV light) using the mask plate 300 having a light transmissive region tr corresponding to the first barrier wall and the second barrier wall, to generate an exposed first negative photoresist material layer 231 and an exposed second negative photoresist material layer 241. Referring to FIG. 12C, the exposed first negative photoresist material layer 231 and the exposed second negative photoresist material layer 241 are developed to form the first barrier wall 161 and the second barrier wall 161'. Referring to FIG. 12C, FIGS. 3A to 3C, and FIGS. 4A to 4C, the first lower portion 161*l* and the second lower portion 161'*l* are generated by developing the exposed first negative photoresist material layer 231, the first upper portion 161*u* and the second upper portion 161'*u* are generated by developing the exposed second negative photoresist material layer 241. Optionally, a lateral side of the first lower portion 161*l* is non-coplanar with a lateral side of the first upper portion 161*u*, and a lateral side of the second lower portion 161'*l* is non-coplanar with a lateral side of the second upper portion 161'*u*.

Figure 13A:
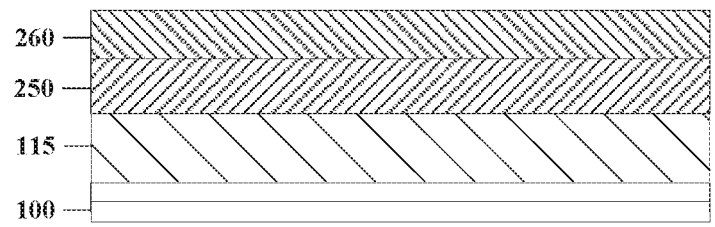
FIGS. 13A to 13D illustrates a method of fabricating a display substrate in some embodiments according to the present disclosure.
Figure 13B:
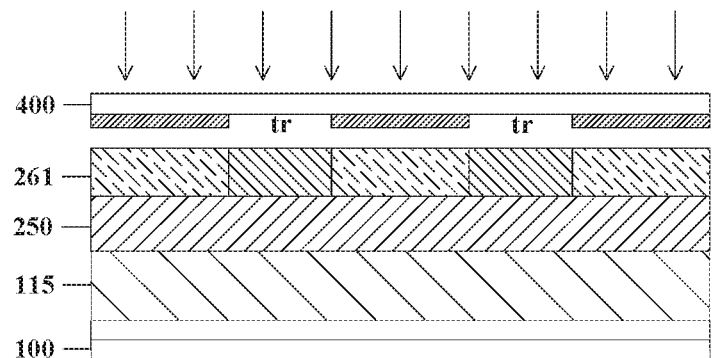
Figure 13C:
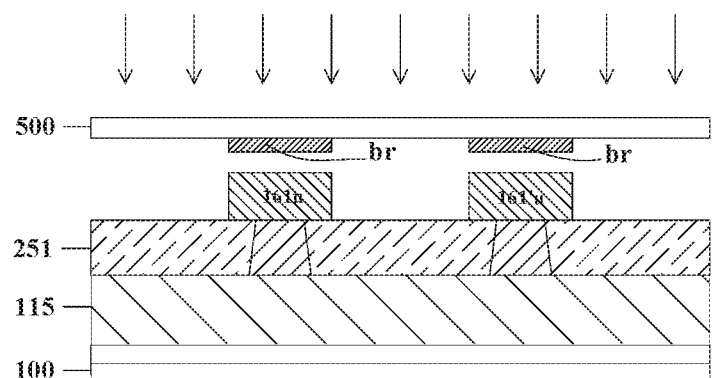
Figure 13D:
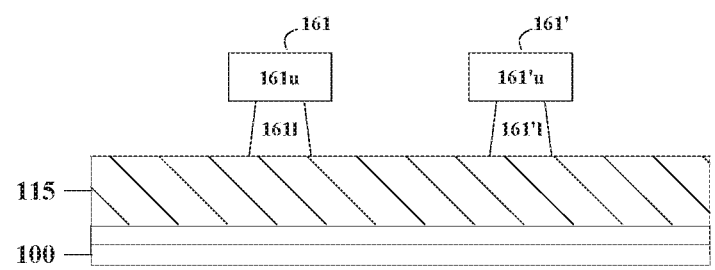

FIGS. 13A to 13D illustrates a method of fabricating a display substrate in some embodiments according to the present disclosure. Referring to FIG. 13A, a positive photoresist material layer 250 is formed in the peripheral area and on a side of the insulating layer 115 away from the base substrate 100, a negative photoresist material layer 260 is formed in the peripheral area and on a side of the positive photoresist material layer 250 away from the base substrate 100. Referring to FIG. 13A and FIG. 13B, a first mask plate 400 having a light transmissive region tr corresponding to the first barrier wall and the second barrier wall is placed on top of the negative photoresist material layer 260. The negative photoresist material layer 260 is exposed (e.g., using UV light) using the first mask plate 400 having the light transmissive region tr corresponding to the first barrier wall and the second barrier wall, to generate an exposed negative photoresist material layer 261. Referring to FIG. 13B and FIG. 13C, the exposed negative photoresist material layer 261 is developed to generate the first upper portion 161*u* and the second upper portion 161'*u*. Referring to FIG. 13B and FIG. 13C, a second mask plate 500 having a light blocking region br corresponding to the first barrier wall and the second barrier wall is placed on top of the first upper portion 161*u* and the second upper portion 161'*u*. The positive photoresist material layer 250 is exposed using the second mask plate 500 having a light blocking region br corresponding to the first barrier wall and the second barrier wall, to generate an exposed positive photoresist material layer 251. The exposed positive photoresist material layer 251 is developed to generate the first lower portion 161*l* and the second lower portion 161'*l*. Referring to FIG. 13D, FIGS. 3A to 3C, and FIGS. 4A to 4C, a lateral side of the first lower portion 161*l* is non-coplanar with a lateral side of the first upper portion 161*u*, and a lateral side of the second lower portion 161'*l* is non-coplanar with a lateral side of the second upper portion 161'*u*.

Figure 14A:
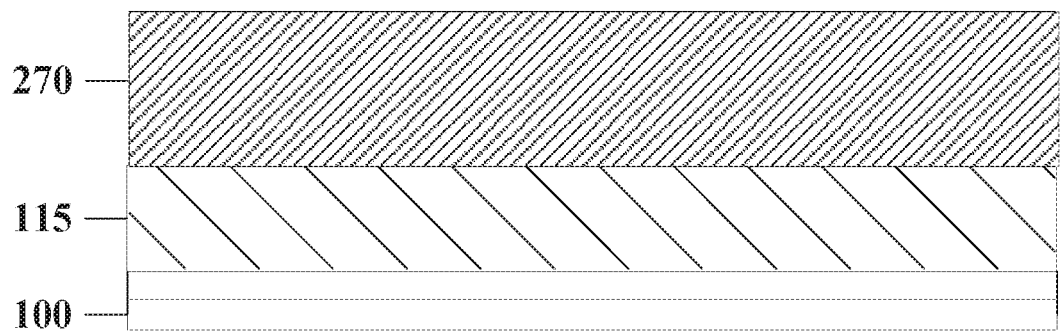
FIGS. 14A to 14E illustrates a method of fabricating a display substrate in some embodiments according to the present disclosure.
Figure 14B:
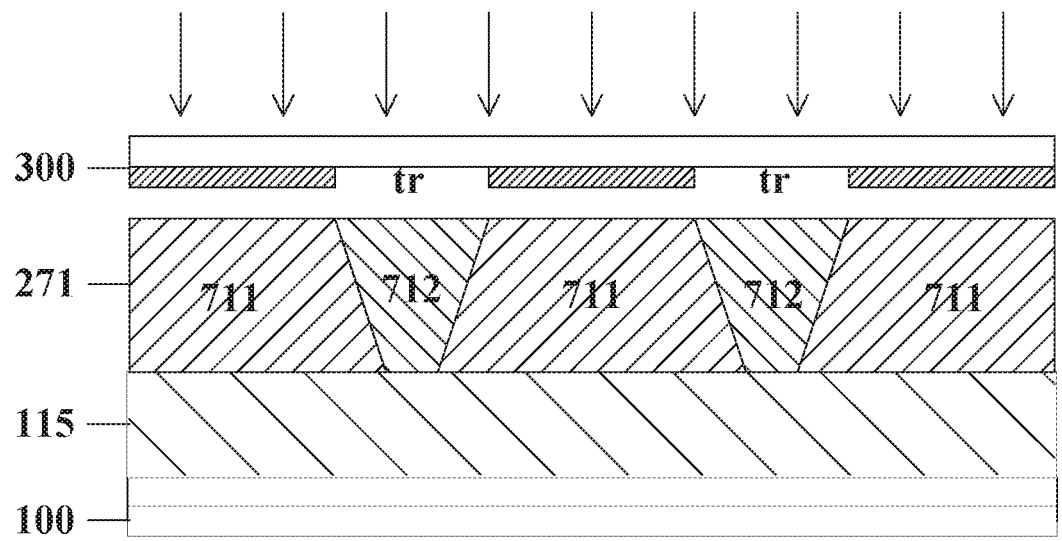
Figure 14C:
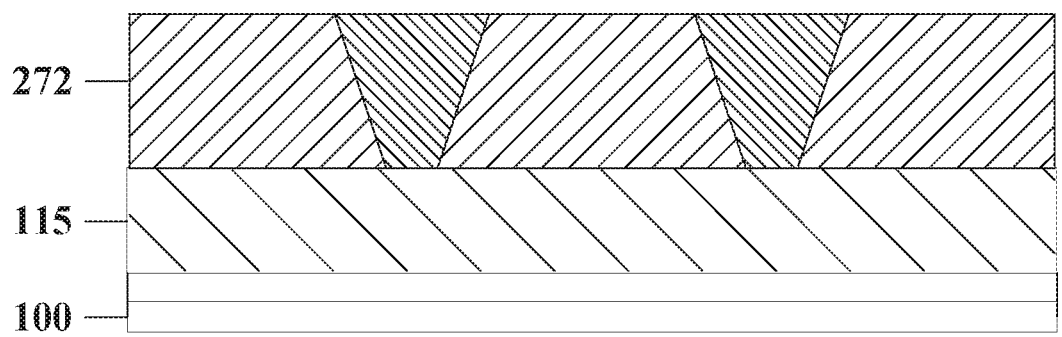
Figure 14D:
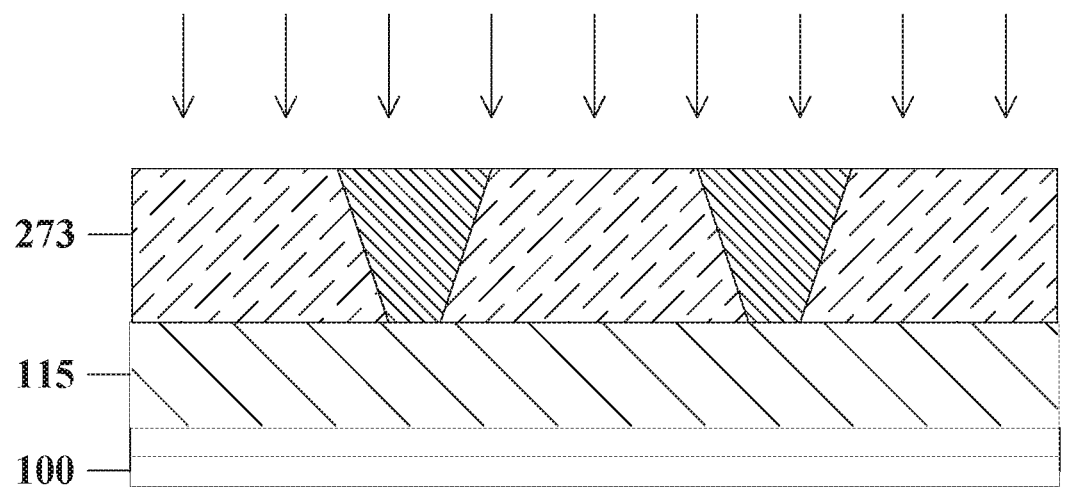
Figure 14E:
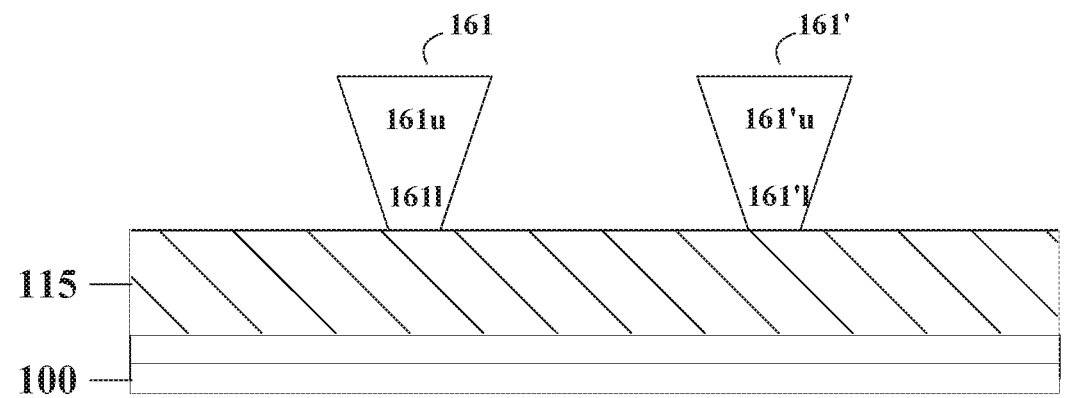

FIGS. 14A to 14E illustrates a method of fabricating a display substrate in some embodiments according to the present disclosure. Referring to FIG. 14A, an image reversal photoresist material layer 270 is formed in the peripheral area and on a side of the insulating layer 115 away from the base substrate 100. Referring to FIG. 14A and FIG. 14B, a mask plate 300 having a light transmissive region tr corresponding to the first barrier wall and the second barrier wall is placed on top of the image reversal photoresist material layer 270. The image reversal photoresist material layer 270 is exposed (e.g., using UV light) using the mask plate 300 having a light transmissive region tr corresponding to the first barrier wall and the second barrier wall, to generate a first exposed photoresist material layer 271, in which portions 712 are exposed and portions 711 are substantially unexposed. Referring to FIG. 14B and FIG. 14C, the first exposed photoresist material layer 271 is treated using a reversal baking process to generate a reversed photoresist material layer 272. The reversal baking process converts the first exposed photoresist material layer 271, which is a negative photoresist, into the reversed photoresist material layer 272, which is a positive photoresist. Referring to FIG. 14C and FIG. 14D, the reversed photoresist material layer 272 is exposed (e.g., without using a mask plate) to generate a second exposed photoresist material layer 273. Referring to FIG. 14D and FIG. 14E, the second exposed photoresist material layer 273 is developed to generate the first barrier wall 161 and the second barrier wall 161'.

Figure 15A:
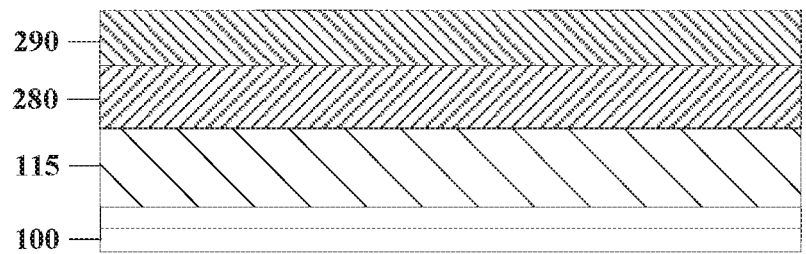
FIGS. 15A to 15D illustrates a method of fabricating a display substrate in some embodiments according to the present disclosure.
Figure 15B:
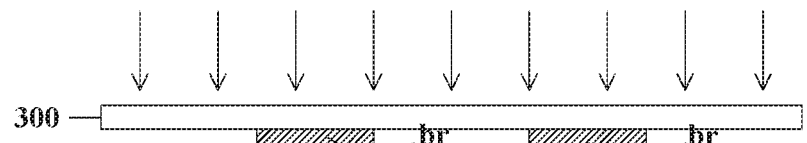
Figure 15C:
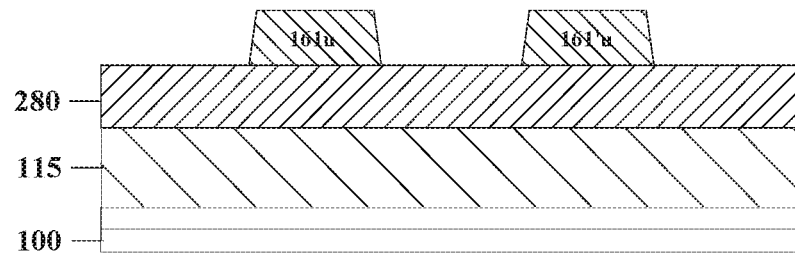
Figure 15D:
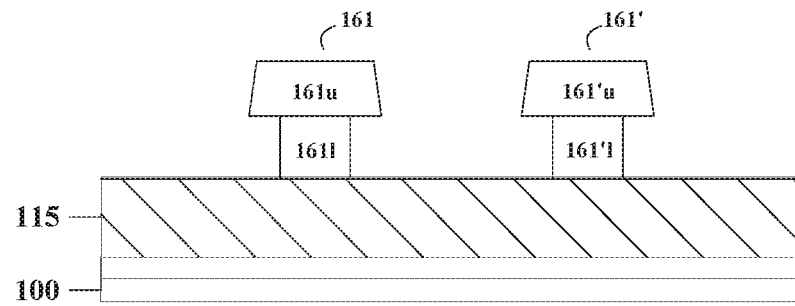

FIGS. 15A to 15D illustrates a method of fabricating a display substrate in some embodiments according to the present disclosure. Referring to FIG. 15A, a metallic material layer 280 is formed in the peripheral area and on a side of the insulating layer 115 away from the base substrate 100. A photoresist material layer 290 is formed in the peripheral area and on a side of the metallic material layer 280 away from the base substrate 100. Optionally, the photoresist material layer 290 is a positive photoresist material layer. Referring to FIG. 15A and FIG. 15B, a mask plate 300 having a light blocking region br corresponding to the first barrier wall and the second barrier wall is placed on top of the photoresist material layer 290. The photoresist material layer 290 is exposed (e.g., using UV light) using the mask plate 300 having a light blocking region br corresponding to the first barrier wall and the second barrier wall, to generate an exposed photoresist material layer 291. Referring to FIG. 15B and FIG. 15C, the exposed photoresist material layer 291 is developed to form the first upper portion 161*u* and the second upper portion 161'*u*. Referring to FIG. 15C and FIG. 15D, the metallic material layer 280 is etched (e.g., using a wet etchant) to form the first lower portion 161*l* and the second lower portion 161'*l*. Referring to FIG. 15D, FIGS. 3A to 3C, and FIGS. 4A to 4C, a lateral side of the first lower portion 161*l* is non-coplanar with a lateral side of the first upper portion 161*u*, and a lateral side of the second lower portion 161'*l* is non-coplanar with a lateral side of the second upper portion 161'*u*.

In some embodiments, the method further includes forming a crack prevention layer in an angled space between a lateral side of the first barrier wall and a surface of the insulating layer. Optionally, the step of forming the crack prevention layer includes forming a positive photoresist material layer on a side of the first barrier wall away from the base substrate; and patterning the positive photoresist material layer to form the crack prevention layer. Optionally, the positive photoresist material layer is removed during the patterning the positive photoresist material layer, except for a portion in the angled space between the lateral side of the first barrier wall and the surface of the insulating layer, thereby forming the crack prevention layer.

In some embodiments, the first barrier wall is formed to include a first lower portion in contact with the insulating layer and a first upper portion on a side of the first lower portion away from the insulating layer. A lateral side of the first lower portion is formed to be covered by the crack prevention layer, and a lateral side of the first upper portion is formed to be absent of the crack prevention layer. An orthographic projection of the first upper portion on the base substrate covers an orthographic projection of the first lower portion on the base substrate. A first lateral side of the first lower portion forms a first angled space with a surface of the insulating layer. A second lateral side of the first lower portion forms a second angled space with the surface of the insulating layer.

In some embodiments, the first barrier wall is formed so that a side of the first upper portion away from the base substrate is wider than a side of the first upper portion closer to the base substrate; and a side of the first lower portion away from the base substrate is wider than a side of the first lower portion closer to the base substrate. Optionally, a cross-section of the first barrier wall along a plane perpendicular to the insulating layer along a direction from the first lateral side to the second lateral side has a substantially inverted trapezoidal shape.

In some embodiments, the crack prevention layer is formed to include a first crack prevention sub-layer in the first angled space and a second crack prevention sub-layer in the second angled space. Optionally, the first crack prevention sub-layer is formed to cover a first lateral side of the first lower portion. Optionally, the second crack prevention sub-layer is formed to cover the second lateral side of the first lower portion. Optionally, the first lower portion, the first crack prevention sub-layer, and the second crack prevention sub-layer are formed to collectively constitute a structure having a side away from the base substrate narrower than a side closer to the base substrate. Optionally, the crack prevention layer is formed so that a height of the first crack prevention sub-layer relative to the surface of the insulating layer is no more than half of a height of the first barrier wall relative to the surface of the insulating layer, and a height of the second crack prevention sub-layer relative to the surface of the insulating layer is no more than half of a height of the first barrier wall relative to the surface of the insulating layer.

In some embodiments, the method further includes forming an inorganic blocking layer covering the first barrier wall and the crack prevention layer. The inorganic blocking layer is limited in the peripheral area. Optionally, the inorganic blocking layer is formed to be in direct contact with the first barrier wall, the crack prevention layer, and the insulating layer. Optionally, the inorganic blocking layer is formed to completely cover, without cracks, lateral sides of a structure formed by the first barrier wall and the crack prevention layer together.

In some embodiments, the method further includes forming one or a combination of an organic material layer and a cathode layer on a side of the inorganic blocking layer away from the base substrate, isolated into discontinued portions by lateral sides of the first barrier wall.

In some embodiments, the method further includes forming an encapsulating layer to encapsulate the plurality of light emitting elements. Optionally, at least one inorganic sub-layer of the encapsulating layer is formed to extend from the display area into the peripheral area. Optionally, the at least one inorganic sub-layer of the encapsulating layer is formed on a side of the inorganic blocking layer away from the base substrate. Optionally, the at least one inorganic sub-layer of the encapsulating layer is formed to completely cover, without cracks, a portion of the inorganic blocking layer covering the lateral sides of the structure formed by the first barrier wall and the crack prevention layer together.

In some embodiments, the method further includes forming a second barrier wall in the peripheral area and on a side of the insulating layer away from the base substrate, the second barrier wall forming a second enclosure substantially surrounding a second area.

Figure 16A:
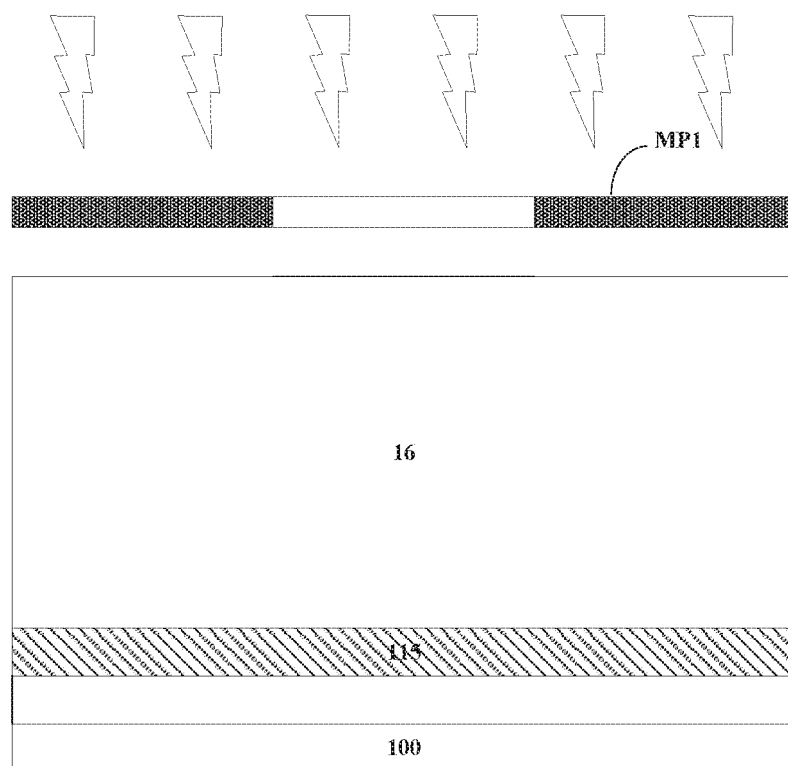
FIGS. 16A to 16F illustrates a method of fabricating a display substrate in some embodiments according to the present disclosure.

FIGS. 16A to 16F illustrate a method of fabricating a display substrate in some embodiments according to the present disclosure. Referring to FIG. 16A, a negative photoresist material layer 16 is formed on the insulating layer 115, the negative photoresist material layer 16 is exposed using a first mask plate MP1, the region of the first mask plate MP1 corresponding to the first barrier wall 161 is light transmissive, and the region of the first mask plate MP1 corresponding to portions outside the first barrier wall 161 is light blocking. The exposed negative photoresist material layer 16 is then developed.

Figure 16B:
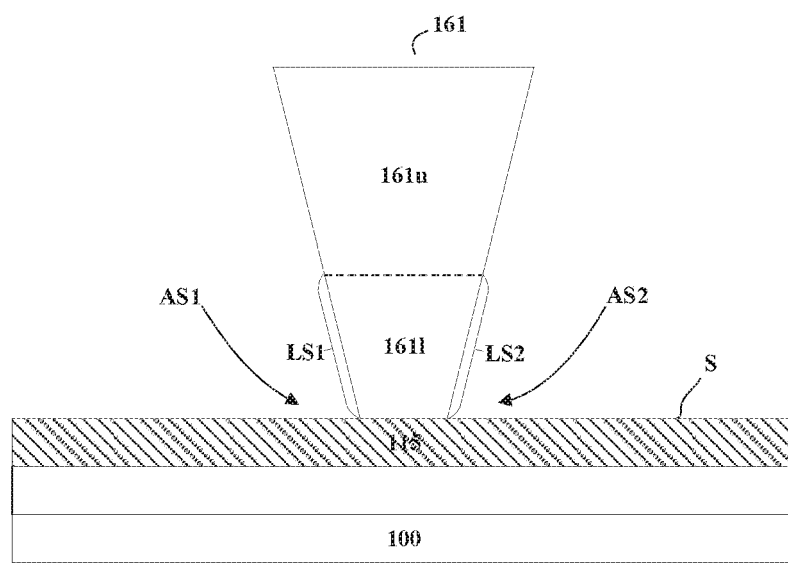

Referring to FIG. 16B, due to the property of the negative photoresist material, exposure and development of the negative photoresist material layer 16 results in an undercut profile of the first barrier wall 161, e.g., a side of the first barrier wall 161 away from the base substrate 100 is wider than a side of the first barrier wall 161 closer to the base substrate 100.

Figure 16C:
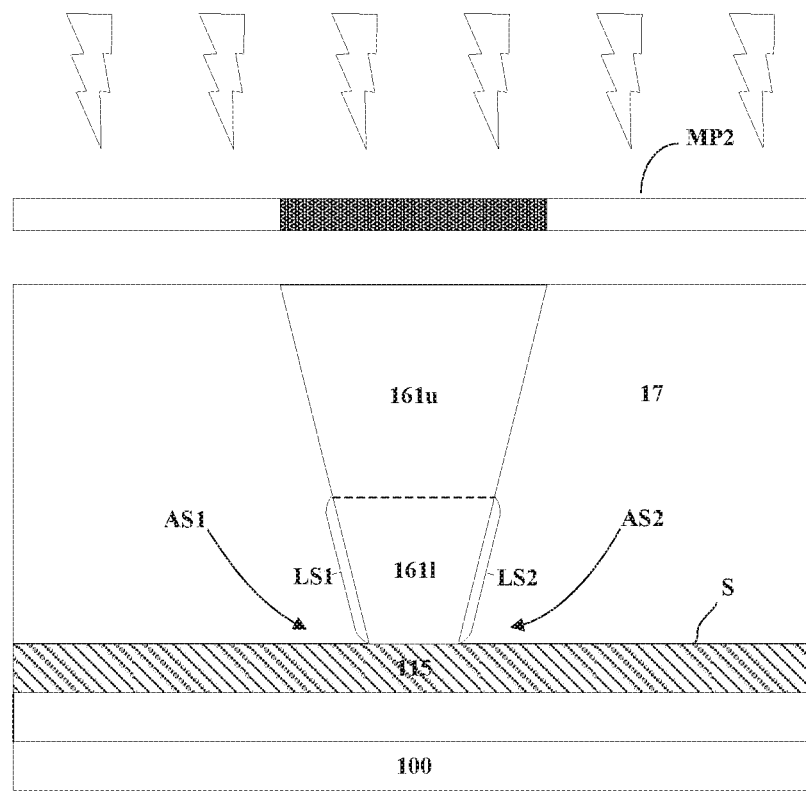

Referring to FIG. 16C, a positive photoresist material layer 17 is then formed on the insulating layer 115. The positive photoresist material layer 17 is exposed using a second mask plate MP2, the region of the second mask plate MP2 corresponding to the first barrier wall 161 is light blocking, and the region of the second mask plate MP2 corresponding to portions outside the first barrier wall 161 is light transmissive. The exposed positive photoresist material layer 17 is then developed.

Figure 16D:
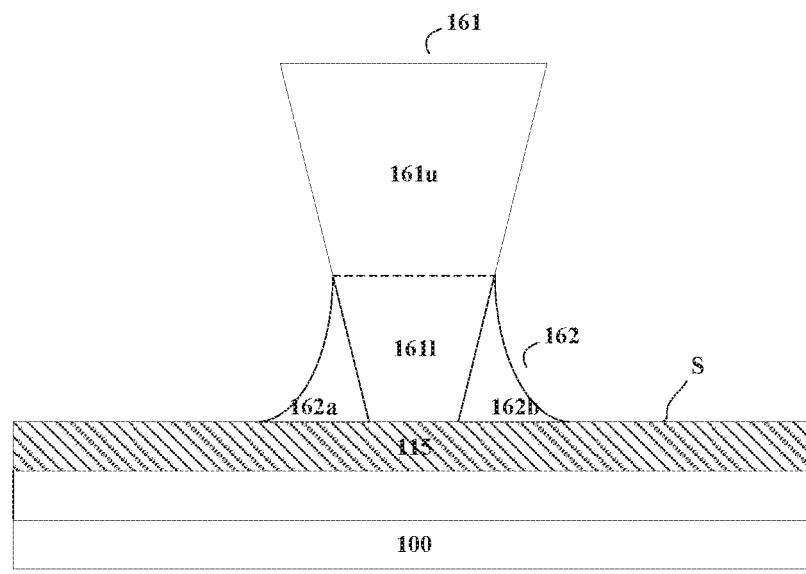

Referring to FIG. 16D, the positive photoresist material is removed except for those in the first angled space AS1 and the second angled spaced AS2 because the positive photoresist material in these spaces are not exposed to light. A crack prevention layer 162 including a first crack prevention sub-layer 162a in the first angled space AS1 and a second crack prevention sub-layer 162b in the second angled spaced AS2 is formed.

Figure 16E:
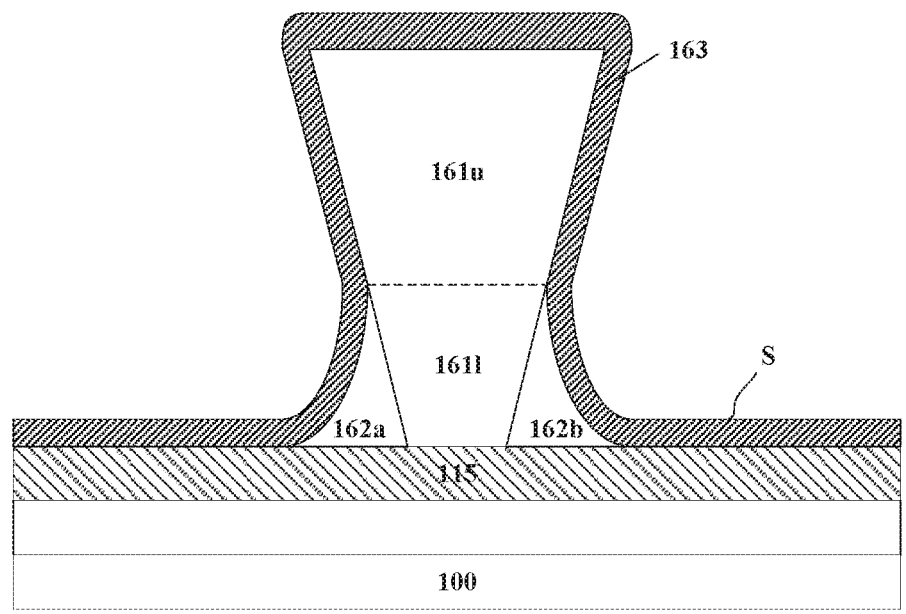

Referring to FIG. 16E, an inorganic blocking layer 163 is formed to cover the first barrier wall 161 and the crack prevention layer 162. The inorganic blocking layer 163 is formed to be in direct contact with the first barrier wall 161, the crack prevention layer 162, and the insulating layer 115. The inorganic blocking layer 163 completely covers, without cracks, lateral sides of a structure formed by the first barrier wall 161 and the crack prevention layer 162 together.

Figure 16F:
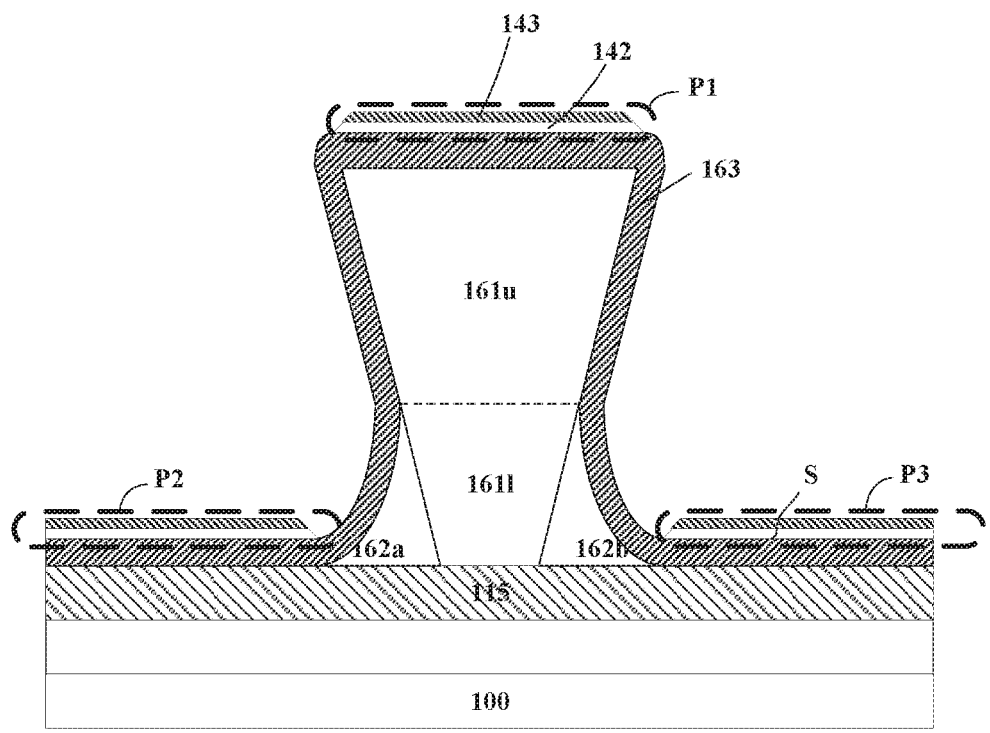

Referring to FIG. 16F, during an open mask process, one or a combination of an organic material layer 142 and a cathode layer 143 is deposited on the base substrate 100. In the peripheral area, the organic material layer 142 and the cathode layer 143 are formed on a side of the inorganic blocking layer 163 away from the base substrate 100, isolated into discontinued portions (P1, P2, and P3) by lateral sides of the first barrier wall 161.

Referring to FIG. 7, an encapsulating layer 150 is formed on the display substrate. The first inorganic encapsulating sub-layer 151 and the second inorganic encapsulating sub-layer 153 are formed to extend from the display area DA into the peripheral area PA. In the peripheral area PA, the first inorganic encapsulating sub-layer 151 and the second inorganic encapsulating sub-layer 153 are formed on a side of the inorganic blocking layer 163 away from the base substrate 100.

In another aspect, the present disclosure provides a display apparatus including a display substrate described herein or fabricated by a method described herein, and one or more integrated circuits connected to the display substrate. Optionally, the display apparatus includes a display panel. Optionally, the display panel includes the display substrate described herein or fabricated by a method described herein, and a counter substrate. Examples of appropriate display apparatuses include, but are not limited to, an electronic paper, a mobile phone, a tablet computer, a television, a monitor, a notebook computer, a digital album, a GPS, etc. Optionally, the display apparatus further includes one or more integrated circuits connected to the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a display substrate having a display area and a peripheral area, comprising:
    forming a plurality of light emitting elements on a base substrate and in the display area;
    forming an encapsulating layer on a side of the plurality of light emitting elements distal to the base substrate to encapsulate the plurality of light emitting elements;
    forming an insulating layer, wherein the insulating layer is formed between the encapsulating layer and the base substrate;
    forming a first barrier wall in the peripheral area and on a side of the insulating layer away from the base substrate, the first barrier wall forming a first enclosure substantially surrounding a first area;
    forming an inorganic blocking layer; and
    forming one or a combination of an organic material layer and a cathode layer on a side of the inorganic blocking layer away from the base substrate, the one or combination of the organic material layer and the cathode layer isolated into discontinued portions by lateral sides of the first barrier wall;
    wherein the first barrier wall is formed to comprise a first lower portion in contact with the insulating layer and a first upper portion on a side of the first lower portion away from the insulating layer;
    an orthographic projection of the first upper portion on the base substrate covers an orthographic projection of the first lower portion on the base substrate;
    the first barrier wall is formed so that a side of the first barrier wall away from the base substrate is wider than a side of the first barrier wall closer to the base substrate, along a width direction of the first barrier wall from the peripheral area to the display area;
    the inorganic blocking layer is limited to the peripheral area;
    the inorganic blocking layer at least partially covers, and is in direct contact with, a top surface and a lateral surface of the first upper portion;
    the inorganic blocking layer at least partially covers, and is in direct contact with, a lateral surface of the first lower portion;
    the inorganic blocking layer is formed to be in direct contact with the first barrier wall and the insulating layer; and
    at least one inorganic sub-layer of the encapsulating layer covers a portion of the inorganic blocking layer covering the first barrier wall.

2. The method of claim 1, wherein forming the first barrier wall comprises:
    forming a negative photoresist material layer in the peripheral area and on a side of the insulating layer away from the base substrate;
    exposing the negative photoresist material layer using a mask plate having a light transmissive region corresponding to the first barrier wall to generate an exposed negative photoresist material layer; and
    developing the exposed negative photoresist material layer to form the first barrier wall;
    wherein the first barrier wall is formed to have an undercut profile.

3. The method of claim 2, wherein a lateral side of the first lower portion is substantially co-planar with a lateral side of the first upper portion.

4. The method of claim 1, wherein forming the first barrier wall comprises:
    forming an image reversal photoresist material layer in the peripheral area and on a side of the insulating layer away from the base substrate;
    exposing the image reversal photoresist material layer using a mask plate having a light transmissive region corresponding to the first barrier wall to generate a first exposed photoresist material layer;
    reversal baking the first exposed photoresist material layer to generate a reversed photoresist material layer;
    exposing the reversed photoresist material layer to generate a second exposed photoresist material layer; and
    developing the second exposed photoresist material layer to form the first barrier wall;
    wherein the first barrier wall is formed to have an undercut profile.

5. The method of claim 4, wherein a lateral side of the first lower portion is substantially co-planar with a lateral side of the first upper portion.

6. The method of claim 1, wherein forming the first barrier wall comprises:
    forming a first material layer in the peripheral area and on a side of the insulating layer away from the base substrate;

forming a second material layer in the peripheral area and on a side of the first material layer away from the base substrate; and patterning the first material layer and the second material layer to form the first barrier wall.

7. The method of claim 6, wherein the first material layer is a first positive photoresist material layer and the second material layer is a second positive photoresist material layer; and the first positive photoresist material layer is more sensitive to exposure as compared to the second positive photoresist material layer;

wherein forming the first barrier wall comprises:

forming the first positive photoresist material layer in the peripheral area and on a side of the insulating layer away from the base substrate;

forming the second positive photoresist material layer in the peripheral area and on a side of the first positive photoresist material layer away from the base substrate;

exposing the first positive photoresist material layer and the second positive photoresist material layer simultaneously using a mask plate having a light blocking region corresponding to the first barrier wall to generate an exposed first positive photoresist material layer and an exposed second positive photoresist material layer; and developing the exposed first positive photoresist material layer and the exposed second positive photoresist material layer to form the first barrier wall;

wherein the first lower portion is generated by developing the exposed first positive photoresist material layer;

the first upper portion is generated by developing the exposed second positive photoresist material layer; and a lateral side of the first lower portion is non-coplanar with a lateral side of the first upper portion.

8. The method of claim 6, wherein the first material layer is a positive photoresist material layer and the second material layer is a negative photoresist material layer;

wherein forming the first barrier wall comprises:

forming the positive photoresist material layer in the peripheral area and on a side of the insulating layer away from the base substrate;

forming the negative photoresist material layer in the peripheral area and on a side of the positive photoresist material layer away from the base substrate;

exposing the negative photoresist material layer using a first mask plate having a light transmissive region corresponding to the first barrier wall to generate an exposed negative photoresist material layer;

developing the exposed negative photoresist material layer to generate the first upper portion;

exposing the positive photoresist material layer using a second mask plate having a light blocking region corresponding to the first barrier wall to generate an exposed positive photoresist material layer; and developing the exposed positive photoresist material layer to generate the first lower portion;

wherein a lateral side of the first lower portion is non-coplanar with a lateral side of the first upper portion.

9. The method of claim 6, wherein the first material layer is a first negative photoresist material layer and the second material layer is a second negative photoresist material layer; and the second negative photoresist material layer is more sensitive to exposure as compared to the first negative photoresist material layer;

wherein forming the first barrier wall comprises:

forming the first negative photoresist material layer in the peripheral area and on a side of the insulating layer away from the base substrate;

forming the second negative photoresist material layer in the peripheral area and on a side of the first negative photoresist material layer away from the base substrate;

exposing the first negative photoresist material layer and the second negative photoresist material layer simultaneously using a mask plate having a light transmissive region corresponding to the first barrier wall to generate an exposed first negative photoresist material layer and an exposed second negative photoresist material layer; and developing the exposed first negative photoresist material layer and the exposed second negative photoresist material layer to form the first barrier wall;

wherein the first lower portion is generated by developing the exposed first negative photoresist material layer;

the first upper portion is generated by developing the exposed second negative photoresist material layer; and a lateral side of the first lower portion is non-coplanar with a lateral side of the first upper portion.

10. The method of claim 6, wherein the first material layer is a metallic material layer and the second material layer is a photoresist material layer; and wherein forming the first barrier wall comprises:

forming the metallic material layer in the peripheral area and on a side of the insulating layer away from the base substrate;

forming the photoresist material layer in the peripheral area and on a side of the metallic material layer away from the base substrate;

exposing the photoresist material layer to generate an exposed photoresist material layer;

developing the exposed photoresist material layer to form the first upper portion; and etching the metallic material layer to form the first lower portion.

11. The method of claim 6, wherein the first lower portion has a first side in contact with the insulating layer and a second side opposite to the first side, the first side and the second side being connected by the lateral side of the first lower portion;

the first upper portion has a third side in contact with the first lower portion and a fourth side opposite to the third side, the third side and the fourth side being connected by the lateral side of the first upper portion; and the third side is wider than the first side and the second side along the width direction of the first barrier wall.

12. The method of claim 1, further comprising punching an aperture through the display substrate to form a window region;

wherein the window region is substantially surrounded by the first enclosure.

13. The method of claim 1, further comprising forming a crack prevention layer in an angled space between a lateral side of the first barrier wall and a surface of the insulating layer;

wherein the inorganic blocking layer further covers the crack prevention layer;

the inorganic blocking layer is formed to be in direct contact with the crack prevention layer; and the inorganic blocking layer is formed to cover lateral surface of a structure formed by a combination of the first barrier wall and the crack prevention layer.

14. The method of claim 13, wherein forming the crack prevention layer comprises:
- forming a positive photoresist material layer on a side of the first barrier wall away from the base substrate; and
- patterning the positive photoresist material layer to form the crack prevention layer;
- wherein the positive photoresist material layer is removed during the patterning the positive photoresist material layer, except for a portion in the angled space between the lateral side of the first barrier wall and the surface of the insulating layer, thereby forming the crack prevention layer.

15. A display substrate having a display area and a peripheral area, comprising:
- a base substrate;
- a plurality of light emitting elements on the base substrate and in the display area;
- an encapsulating layer on a side of the plurality of light emitting elements distal to the base substrate to encapsulate the plurality of light emitting elements;
- an insulating layer between the encapsulating layer and the base substrate;
- a first barrier wall in the peripheral area and on a side of the insulating layer away from the base substrate, the first barrier wall forming a first enclosure substantially surrounding a first area; and
- an inorganic blocking layer;
- one or a combination of an organic material layer and a cathode layer on a side of the inorganic blocking layer away from the base substrate, the one or combination of the organic material layer and the cathode layer isolated into discontinued portions by lateral sides of the first barrier wall;
- wherein the first barrier wall comprises a first lower portion in contact with the insulating layer and a first upper portion on a side of the first lower portion away from the insulating layer;
- an orthographic projection of the first upper portion on the base substrate covers an orthographic projection of the first lower portion on the base substrate;
- a side of the first barrier wall away from the base substrate is wider than a side of the first barrier wall closer to the base substrate, along a width direction of the first barrier wall from the peripheral area to the display area;
- the inorganic blocking layer is limited to the peripheral area;
- the inorganic blocking layer at least partially covers, and is in direct contact with, a top surface and a lateral surface of the first upper portion;
- the inorganic blocking layer at least partially covers, and is in direct contact with, a lateral surface of the first lower portion;
- the inorganic blocking layer is in direct contact with the first barrier wall and the insulating layer; and
- at least one inorganic sub-layer of the encapsulating layer covers a portion of the inorganic blocking layer covering the first barrier wall.

16. The display substrate of claim 15, wherein a lateral side of the first lower portion is non-coplanar with a lateral side of the first upper portion;
- the first lower portion has a first side in contact with the insulating layer and a second side opposite to the first side, the first side and the second side being connected by the lateral side of the first lower portion;
- the first upper portion has a third side in contact with the first lower portion and a fourth side opposite to the third side, the third side and the fourth side being connected by the lateral side of the first upper portion; and
- the third side is wider than the first side and the second side along the width direction of the first barrier wall.

17. The display substrate of claim 15, wherein the first enclosure substantially surrounds a window region of the display substrate; and
- the display substrate has an aperture extending through the window region for installing an accessory therein.

18. The display substrate of claim 15, further comprising a crack prevention layer in an angled space between a lateral side of the first barrier wall and a surface of the insulating layer;
- wherein the inorganic blocking layer further covers the crack prevention layer;
- the inorganic blocking layer is formed to be in direct contact with the crack prevention layer; and
- the inorganic blocking layer is formed to cover lateral surface of a structure formed by a combination of the first barrier wall and the crack prevention layer.

19. The display substrate of claim 18, wherein
- a first lateral side of the first lower portion forms a first angled space with a surface of the insulating layer;
- a second lateral side of the first lower portion forms a second angled space with the surface of the insulating layer; and
- the crack prevention layer comprises a first crack prevention sub-layer in the first angled space and a second crack prevention sub-layer in the second angled space.

20. A display apparatus, comprising the display substrate of claim 15, and one or more integrated circuits connected to the display substrate.

* * * * *